(12) United States Patent
Yoon et al.

(10) Patent No.: US 11,177,671 B2
(45) Date of Patent: Nov. 16, 2021

(54) POWER MANAGEMENT METHOD AND ELECTRONIC DEVICE SUPPORTING SAME

(71) Applicant: Samsung Electronics Co., Ltd., Gyeonggi-do (KR)

(72) Inventors: Yeong Gyu Yoon, Gyeonggi-do (KR); Min Sung Lee, Gyeonggi-do (KR); Min Woo Yoo, Gyeonggi-do (KR); Jong Chul Choi, Gyeonggi-do (KR)

(73) Assignee: Samsung Electronics Co., Ltd

( * ) Notice: Subject to any disclaimer, the term of this patent is extended or adjusted under 35 U.S.C. 154(b) by 243 days.

(21) Appl. No.: 16/464,018

(22) PCT Filed: Dec. 19, 2017

(86) PCT No.: PCT/KR2017/015016
§ 371 (c)(1),
(2) Date: May 24, 2019

(87) PCT Pub. No.: WO2018/117592
PCT Pub. Date: Jun. 28, 2018

(65) Prior Publication Data
US 2019/0379216 A1    Dec. 12, 2019

(30) Foreign Application Priority Data

Dec. 22, 2016  (KR) .................. 10-2016-0176929

(51) Int. Cl.
*H02J 7/00*    (2006.01)
*G06F 1/16*    (2006.01)
(Continued)

(52) U.S. Cl.
CPC ............ *H02J 7/0021* (2013.01); *G01R 31/36* (2013.01); *G01R 31/382* (2019.01); *G06F 1/165* (2013.01);
(Continued)

(58) Field of Classification Search
CPC ...... H02J 7/0021; H02J 7/0014; H02J 7/0013; H02J 7/0016; H02J 7/342; H02J 7/0044;
(Continued)

(56) References Cited

U.S. PATENT DOCUMENTS

| 7,366,925 B2 | 4/2008 | Keely et al. |
| 2006/0279250 A1 | 12/2006 | Keely et al. |

(Continued)

FOREIGN PATENT DOCUMENTS

| KR | 1020060119011 | 11/2006 |
| KR | 1020130142250 | 12/2013 |

(Continued)

OTHER PUBLICATIONS

PCT/ISA/210 Search Report issued on PCT/KR2017/015016 pp. 5.
PCT/ISA/237 Written Opinion issued on PCT/KR2017/015016, pp. 5.

*Primary Examiner* — Zixuan Zhou
(74) *Attorney, Agent, or Firm* — The Farrell Law Firm, P.C.

(57) ABSTRACT

Disclosed is an electronic device comprising: a housing; a seating portion formed inside the housing such that a first external electronic device and a second external electronic device are seated thereon; at least one interface that is electrically connected to the first external electronic device and to the second external electronic device and can transmit/receive power to/from the same; and a processor electrically connected to the at least one interface, wherein the processor acquires a first remaining time to use a first battery included in the first external electronic device connected through the at least one interface; the processor acquires a second remaining time to use a second battery included in the second external electronic device connected through the at least one interface; and the processor manages power of at least one of the first battery and the second battery such that (Continued)

that the first remaining time to use the first battery and the second remaining time to use the second battery become substantially identical. Besides, various embodiments inferable from the specification are possible.

14 Claims, 17 Drawing Sheets

(51) Int. Cl.

| | | |
|---|---|---|
| *G06F 1/3212* | (2019.01) | |
| *H04R 1/10* | (2006.01) | |
| *G01R 31/382* | (2019.01) | |
| *G01R 31/36* | (2020.01) | |
| *B64C 39/02* | (2006.01) | |
| *H02J 7/34* | (2006.01) | |

(52) U.S. Cl.
CPC .......... *G06F 1/1635* (2013.01); *G06F 1/3212* (2013.01); *H02J 7/0013* (2013.01); *H02J 7/0014* (2013.01); *H02J 7/0016* (2013.01); *H04R 1/1025* (2013.01); *B64C 39/024* (2013.01); *B64C 2201/027* (2013.01); *B64C 2201/066* (2013.01); *B64C 2201/201* (2013.01); *H02J 7/342* (2020.01)

(58) Field of Classification Search
CPC ... H02J 7/00034; G01R 31/36; G01R 31/382; B64C 39/024; B64C 2201/027; B64C 2201/066; B64C 2201/201; Y02D 10/00; G06F 1/1628; G06F 1/1635; G06F 1/165; G06F 1/3212; H04R 1/10; H04R 1/1025
USPC .................................................. 320/103, 128
See application file for complete search history.

(56) References Cited

U.S. PATENT DOCUMENTS

| | | | |
|---|---|---|---|
| 2013/0336510 A1 | 12/2013 | Lee et al. | |
| 2014/0091623 A1 | 4/2014 | Shippy et al. | |
| 2014/0117921 A1* | 5/2014 | Suomela | H02J 7/342 |
| | | | 320/103 |

FOREIGN PATENT DOCUMENTS

| | | |
|---|---|---|
| KR | 101456701 | 11/2014 |
| KR | 101508712 | 4/2015 |
| KR | 1020150038347 | 4/2015 |

* cited by examiner

POWER MANAGEMENT METHOD AND ELECTRONIC DEVICE SUPPORTING SAME

PRIORITY

This application is a National Phase Entry of PCT International Application No. PCT/KR2017/015016 which was filed on Dec. 19, 2017, and claims priority to Korean Patent Application No. 10-2016-0176929, which was filed on Dec. 22, 2016, the content of each of which is incorporated herein by reference.

TECHNICAL FIELD

Embodiments of the disclosure relate to a power management method and an electronic device supporting the same.

BACKGROUND ART

Recently, as various types of electronic devices have been widely used, there is a growing interest in electronic devices usable both indoors and outdoors and while moving. For example, more and more users are using an unmanned aerial vehicle (UAV) (or a drone), a wireless headset, or a wireless earphone. Such an electronic device may be precharged for mobility and packaged in a package such as a case for transportation and storage.

On the other hand, the above-described electronic device may be provided as a set with other electronic devices or may be operated by being paired. For example, a drone may be paired with and controlled by a controller and a wireless headset or wireless earphones may be provided as a set to correspond to both ears.

DISCLOSURE

Technical Problem

Conventional packages provided to accommodate the above-described electronic devices merely provide functions for accommodating electronic devices. Accordingly, the electronic devices had to be taken out of the package to charge the battery of the electronic devices accommodated in the package. Also, in the case of electronic devices that are provided in a set or operated in pairs, when the battery of one of the electronic devices is discharged, other electronic devices may not be used.

Embodiments disclosed in the disclosure may provide a method of accommodating a plurality of external electronic devices and managing power of batteries of the external electronic devices such that remaining battery times of the external electronic devices are substantially the same, and an electronic device supporting the same.

Technical Solution

According to an embodiment of the disclosure, an electronic device includes a housing, a seating portion formed in the housing, a first external electronic device and a second external electronic device being seated in the seating portion, at least one interface electrically connected to the first external electronic device and the second external electronic device to transmit and receive power, and a processor electrically connected to the at least one interface, wherein the processor obtains a first remaining battery time of a first battery included in the first external electronic device connected through the at least one interface, obtains a second remaining battery time of a second battery included in the second external electronic device connected through the at least one interface, and manages power of at least one of the first battery and the second battery such that the first remaining battery time of the first battery and the second remaining battery time of the second battery are substantially equal to each other.

In addition, according to an embodiment of the disclosure, a power management method of an electronic device includes obtaining a first remaining battery time of a first battery included in a first external electronic device connected through at least one interface, obtaining a second remaining battery time of a second battery included in a second external electronic device connected through the at least one interface, and managing power of at least one of the first battery and the second battery such that the first remaining battery time of the first battery and the second remaining battery time of the second battery are substantially equal to each other.

Advantageous Effects

According to the embodiments disclosed in this disclosure, the mobility and usability of the external electronic devices may be increased by managing the power of the batteries of the external electronic devices such that remaining battery times of the external electronic devices accommodated are substantially the same.

In addition, various effects directly or indirectly understood through the disclosure may be provided.

MODE FOR INVENTION

Figure 1:
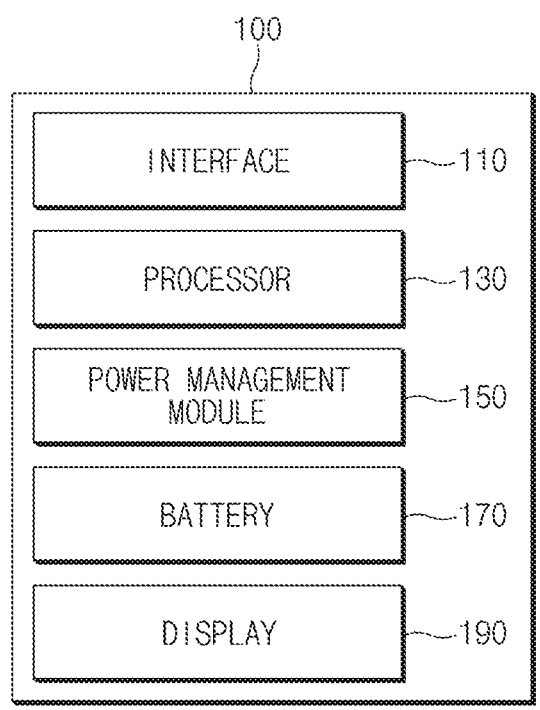
FIG. 1 is a block diagram of an electronic device related to a power management function according to an embodiment.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure. With regard to description of drawings, similar components may be marked by similar reference numerals. As used herein, singular forms may include plural forms as well unless the context clearly indicates otherwise. In the disclosure, the expressions "A or B", "at least one of A or/and B", or the like may include any and all combinations of one or more of the associated listed items. The terms, such as "first", "second", and the like used in the disclosure may be used to refer to various components regardless of the order and/or the priority and to distinguish the relevant components from other components, but do not limit the components. It will be understood that when an component (e.g., a first component) is referred to as being "(operatively or communicatively) coupled with/to" or "connected to" another component (e.g., a second component), it may be directly coupled with/to or connected to the other component or an intervening component (e.g., a third component) may be present.

The term "configured (or set) to . . . " used in the disclosure may be interchangeably used with the terms "suitable for . . . ," "having the capacity to . . . ," "adapted to . . . ," "made to . . . ," "capable of . . . ," or "designed to" in a hardware or software level depending on the situation. The expression "a device configured to" may mean that the device is "capable of" operating together with another device or other components. For example, a "processor configured to perform A, B, and C" may mean a dedicated processor (e.g., an embedded processor) for performing a corresponding operation or a generic-purpose processor (e.g., a central processing unit (CPU) or an application processor) which may perform corresponding operations by executing one or more software programs which are stored in a memory device.

An electronic device according to various embodiments of the disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) audio layer 3 (MP3) players, mobile medical devices, cameras, or wearable devices. The wearable device may include at least one of an accessory type (e.g., watches, rings, bracelets, anklets, necklaces, glasses, contact lens, or head-mounted-devices (HMDs)), a fabric or clothing-integrated type (e.g., an electronic apparel), a body-attached type (e.g., a skin pad or tattoos), or an bio-implantable type circuit. According to embodiments, the electronic device may at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, media boxes (e.g., Samsung HomeSync™, Apple TV™, or Google TV™), game consoles (e.g., Xbox™ or PlayStation™), electronic dictionaries, electronic keys, camcorders, or electronic picture frames.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, global navigation satellite systems (GNSS), event data recorders (EDRs), flight data recorders (FDRs), vehicle infotainment devices, electronic equipment for vessels (for example, navigation systems and gyrocompasses), avionics, security devices, head units for vehicles, industrial or home robots, drones, automatic teller's machines (ATMs) of financial institutions, points of sales (POSs) of stores, or Internet of things (for example, light bulbs, various sensors, sprinkler devices, fire alarms, thermostats, street lamps, toasters, exercise equipment, hot water tanks, heaters, boilers, and the like). According to embodiments, the electronic device may include at least one of parts of furniture, buildings/structures or vehicles, electronic boards, electronic signature receiving devices, projectors, or various measuring instruments (e.g., water meters, electricity meters, gas meters, or wave meters, and the like). According to various embodiments, the electronic device may be flexible or may be a combination of two or more of the above-mentioned various devices. The electronic devices according to embodiments of the disclosure are not limited to the above-mentioned devices. In the disclosure, the term "user" may refer to a person who uses the electronic device or a device that uses the electronic device (for example, an artificial intelligence electronic device).

FIG. 1 is a block diagram of an electronic device related to a power management function according to an embodiment.

An electronic device 100 may accommodate (or receive) a plurality of external electronic devices and manage power of batteries of the external electronic devices such that remaining battery times of the accommodated external electronic devices are substantially equal to one another. As an example, the electronic device 100 may share power of a battery of a first external electronic device having a relatively long remaining battery time among the external electronic devices with a second external electronic device. As another example, when external power is applied, the electronic device 100 may first charge the second external electronic device having a relatively short remaining battery time among the external electronic devices. As still another example, the electronic device 100 may set charge amounts of the batteries of the external electronic devices to be different from one another, based on the remaining battery times of the external electronic devices.

Referring to FIG. 1, the electronic device 100 that provides the above-described functions may include an interface 110 (or a charge/discharge circuit), a processor 130, a power management module 150, an internal battery 170, and a display 190. However, the configuration of the electronic device 100 is not limited thereto. According to various embodiments, the electronic device 100 may omit at least one of the above-described components, or may further include at least one another component.

The interface 110 may be electrically connected to an external electronic device to transmit/receive power. The interface 110 may be connected to the external electronic device and may transfer a command or data input from the connected external electronic device to another component(s) of the electronic device 100, or output a command or data received from another component(s) of the electronic device 100 to the external electronic device. The interface 110 may include at least one of a wired interface (or connector) connected to the external electronic device in a wired manner and a wireless interface connected to the external electronic device in a wireless manner. The interface 110 may include, for example, a USB Type-C, a charge/discharge coil or the like. According to an embodiment, a plurality of interfaces 110 may be provided, and the plurality of interfaces 110 may be connected to different external electronic devices, respectively. As another example, the single interface 110 may be connected to a plurality of external electronic devices. In addition, the interface 110 may provide a connection path to an external power supply.

The processor 130 may perform control and/or communication-related operation or data processing on at least one of the other components of the electronic device 100. The processor 130 may control a plurality of hardware or software components connected to the processor 130 by running, for example, an operating system or an application program, and may perform a variety of data processing and operations. The processor 130 may include one or more of a central processing unit, an application processor (AP), or a communication processor (CP). According to an embodiment, the processor 130 may be implemented with a system on chip (SoC).

According to an embodiment, the processor 130 may obtain information on a remaining battery time, a remaining battery capacity or a remaining battery percentage of a battery included in the external electronic device from the external electronic device connected thereto through the interface 110. In some embodiments, the processor 130 may obtain information on current consumption per hour of the battery from the external electronic device through the interface 110, and calculate the remaining battery time using the obtained current consumption per hour and remaining battery capacity of the battery.

According to an embodiment, the processor 130 may manage power of the batteries of the external electronic devices respectively connected to the plurality of interfaces 110. The processor 130 may supply power of a first battery of a first external electronic device connected to a first interface (e.g., the interface 110) to a second battery of a second external electronic device connected to a second interface (e.g., the interface 110). In some embodiments, the processor 130 may selectively or simultaneously manage power of the batteries of the external electronic devices, even when the plurality of external electronic devices are connected to the single interface 110. As an example, the processor 130 may select one of the external electronic devices through a switching circuit or the like included in the interface 110 to transmit or receive power, or may simultaneously transmit or receive power to or from the external electronic devices through a parallel circuit or the like. Also, the processor 130 may supply power to the batteries of the external electronic devices through the interface 110 when external power is applied or when the power of the internal battery 170 included in the electronic device 100 remains.

The electronic device 100 may connect the external electronic devices to an external power connection (e.g., the interface 110) or the internal battery 170, or provide a current transfer path (or circuit) that connects the external electronic devices to one another such that the power of the batteries of the external electronic devices is shared with or supplied to one another. The current transfer path may include a charge path for charging a battery included in the external electronic device, for example. A plurality of current transfer paths may be provided, and an amount of current supplied through the current transfer path may vary depending on a characteristic value (e.g., a resistance value) of at least one element included in the current transfer path.

According to an embodiment, the processor 130 may manage the power of the batteries of the external electronic devices such that the remaining battery times of the batteries of the external electronic devices are substantially equal to one another, based on the remaining battery times of the batteries of the external electronic devices. As an example, the processor 130 may supply the power of the battery of the first external electronic device, of which the remaining battery time is relatively long, to the battery of the second external electronic device. For example, the processor 130 may select a current transfer path to allow current to be transferred from the battery of the first external electronic device to the battery of the second external electronic device. As another example, when external power is applied or the power of the internal battery 170 remains, the processor 130 may set at least one of orders of charging the batteries of the external electronic devices and charge amounts (or amounts of supply current) of the external electronic devices to be different from one another based on the remaining battery times. For example, the processor 130 may select a current transfer path such that the battery of the second external electronic device of which the remaining battery time is short is first charged. Alternatively, the processor 130 may supply a first amount of current to the battery of the first external electronic device having a relatively long remaining battery time, and a second mount of current, which is larger than the first amount of current, to the battery of the second external electronic device having a relatively short remaining battery time.

To supply different amounts of current to the batteries of the external electronic devices, a plurality of current transfer paths connected to each of the external electronic devices may be provided. For example, a plurality of current transfer paths connected to a battery of any one external electronic device may be provided. Accordingly, the amount of supplied current may be selectively changed according to the remaining battery time of the battery of the external electronic device. For example, the processor 130 may select a current transfer path corresponding to a charge amount determined based on the remaining battery time of the external electronic device among the plurality of current paths. As an example, the processor 130 may select any one of the plurality of current transfer paths through a switching circuit or the like. In some embodiments, a single current transfer path may be connected to each of the batteries of the external electronic devices. In this case, the characteristic value (e.g., resistance value) may be changed such that the current transfer path corresponds to a charge amount determined based on the remaining battery time of the external electronic device. As an example, the current transfer path may include a variable resistor or the like, and the characteristic value of the current transfer path may be changed due to a change in a characteristic value of the variable resistor.

The power management module 150 may manage power of the electronic device 100. According to an embodiment, the power management module 150 may include a power management integrated circuit (PMIC), a charger IC, or a battery (or fuel) gauge. The PMIC may have a wired and/or wireless charging scheme. The wireless charging scheme may include, for example, a magnetic resonance scheme, a magnetic induction scheme, an electromagnetic wave scheme, or the like, and may further include an additional circuit for wireless charging, for example, a coil loop, a resonant circuit, rectifier, or the like. The battery gauge may measure, for example, the remaining battery capacity of the internal battery 170, and a voltage, a current, or a temperature during charging. The internal battery 170 may include, for example, a rechargeable battery and/or a solar cell.

According to an embodiment, the power management module 150 may perform at least some functions of the power management functions of the processor 130 either independently or in cooperation with the processor 130. The power management module 150 may manage power of a battery of an external electronic device connected to the interface 110. As an example, the power management module 150 may manage power of batteries of external electronic devices connected through the interface 110 such that remaining battery times of the batteries of the external electronic devices are substantially equal to one another, based on the remaining battery times of the batteries of the external electronic devices.

The display 190 may display various types of content (e.g., text, images, video, icons, symbols, etc.) to the user. The display 190 may include, for example, a liquid crystal display (LCD), a light emitting diode (LED) display, an organic light emitting diode (OLED) display, or a microelectromechanical system (MEMS) display, or an electronic paper display. According to an embodiment, the display 190 may include a touch screen, and may receive a touch, gesture, proximity, or hovering input using, for example, an electronic pen or a part of the user's body.

According to an embodiment, the display 190 may output a display object corresponding to information related to a remaining battery time, a remaining battery capacity, or a remaining battery percentage obtained from an external electronic device connected through the interface 110. Alternatively, the display 190 may output a display object corresponding to the remaining battery time of the external electronic device, calculated by the processor 130.

Figure 2:
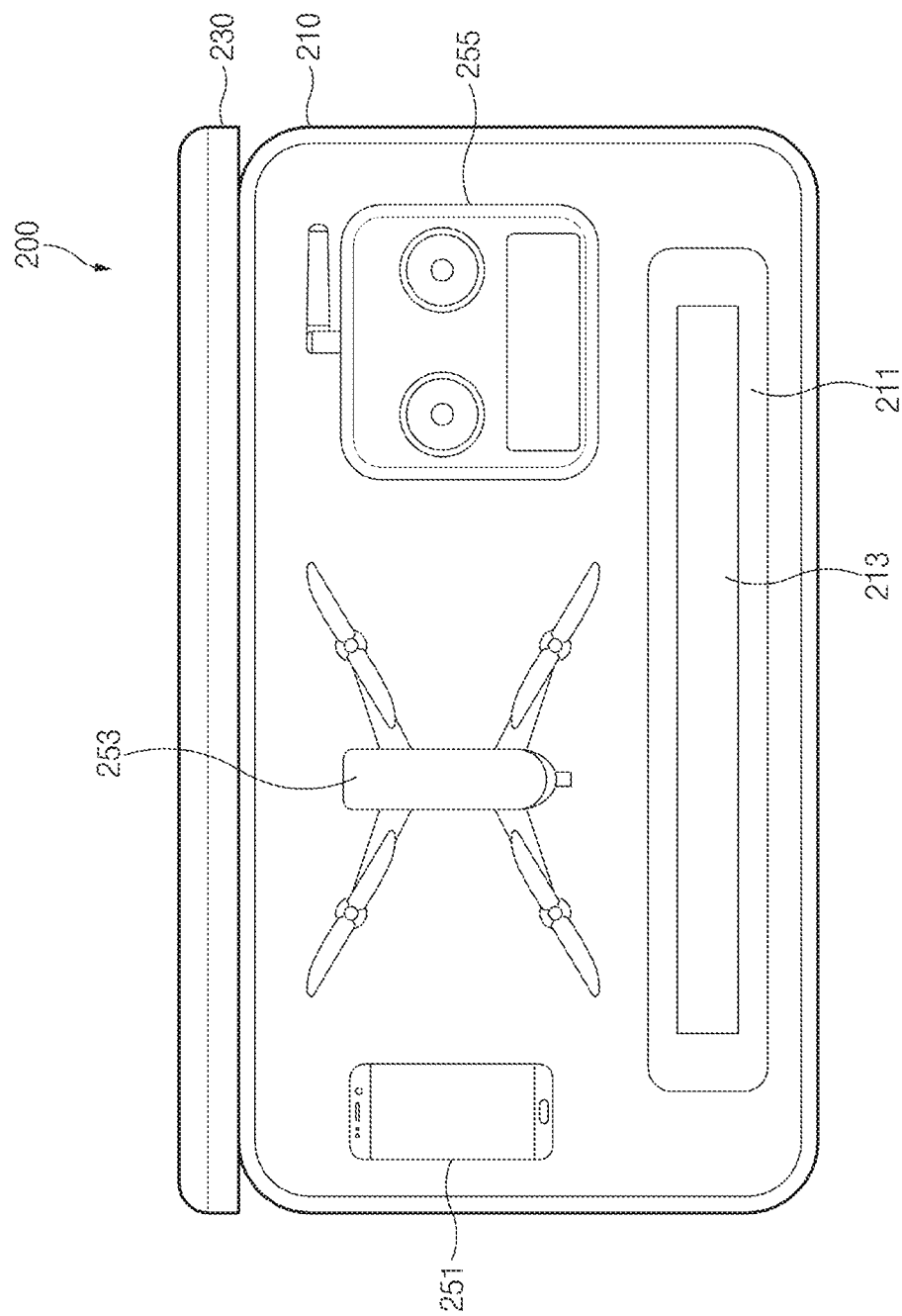
FIG. 2 is a plan view of an electronic device in a state in which a plurality of external electronic devices are accommodated according to an embodiment.

FIG. 2 is a plan view of an electronic device in a state in which a plurality of external electronic devices are accommodated according to an embodiment.

Referring to FIG. 2, an electronic device 200 (e.g., the electronic device 100) may include a housing 210 capable of accommodating a plurality of external electronic devices (e.g., a first external electronic device 251, a second external electronic device 253, or a third external electronic device 255). The housing 210 may include, for example, a front side, a rear side, and a lateral side that partially surrounds a space between the front side and the rear side The lateral side may refer to a side that is visually seen when a thinner side of the electronic device 200 is viewed, the front side, which is a region excluding the lateral side, may refer to a side in a direction in which the external electronic devices are inserted to be seated in the housing 210, and the rear side may refer to a side facing the front side.

According to an embodiment, the housing 210 may provide a space in which the external electronic devices may be accommodated. For example, the housing 210 may include a seating portion in which the external electronic devices are seated. The seating portion may be a portion in which a partial region of the front side of the housing 210 is opened or recessed. The seating portion may be provided to correspond to the shape of the external electronic device. As an example, the seating portion may be formed to correspond to the shape of the external electronic device (e.g., the shape of a rear (or back) surface of the external electronic device). According to an embodiment, the seating portion may be provided to correspond to the number of external electronic devices which the electronic device 200 is capable of accommodating. For example, when the electronic device 200 is capable of accommodating three external electronic devices, three seating portions may be provided. However, the shape and the number of the seating portions are not limited thereto. In some embodiments, a single seating portion may be formed in most regions of the front side of the housing 210, irrespective of the shape and the number of the external electronic devices. In the drawing, there is illustrated that three seating portions are formed in the housing 210 and the first external electronic device 251 (e.g., smartphone), the second external electronic device 253 (e.g. drone) and the third external electronic device 255 (e.g., drone controller) are seated herein.

According to an embodiment, the electronic device 200 may include a display 213. The display 213 may be disposed, for example, in a partial region of the front side of the housing 210. However, the arrangement position of the display 213 is not limited thereto. In some embodiments, the display 213 may be disposed in the lateral or rear side of the housing 210. As another example, the display 213 may be seated in and fixed to one side of a fixing member 211 that is disposed on one side of the housing 210 to fix a component (e.g., a printed circuit board or an internal battery) disposed therein.

According to an embodiment, the electronic device 200 may include a cover 230. The cover 230 may cover at least one side of the housing 210, for example. According to an embodiment, the cover 230 may be openably and closably connected to the housing 210 through a hinge member. For example, the cover 230 may be connected to the front side and/or lateral side of the housing 210 through the hinge member and hinged such that the front side of the housing 210 may be opened or closed. Accordingly, when the cover 230 is opened, the external electronic device may be inserted into the seating portion formed in the housing 210, and when the cover 230 is closed, the external electronic device may be prevented from escaping to the outside. According to an embodiment, in a case where the external electronic device is electrically connected to a contact part (or an interface) disposed in one side of the housing 210, when the cover 230 is closed, the cover 230 may pressurize the external electronic device, thereby allowing the external electronic device to be stably electrically connected to the contact part. The hinge member may have, for example, a cam or serration structure, through which the cover 230 may be pivoted about the front and/or lateral side of the housing 210.

According to an embodiment, the cover 230 may be provided to have at least a partial region made of a transparent material (e.g., glass). As an example, the cover 230 may be provided such that a region corresponding to the display 213 is transparent to allow a screen output through the display 213 to be exposed to the outside in a state in which the cover 230 is closed (at least one side of the housing 210 is covered). In an embodiment, the cover 230 may be provided such that, when there is an external electronic device including a display among the external electronic devices seated in the housing 210, a region corresponding to the display of the external electronic device is transparent. As another example, the display 213 may be disposed in the cover 230.

Figure 3:
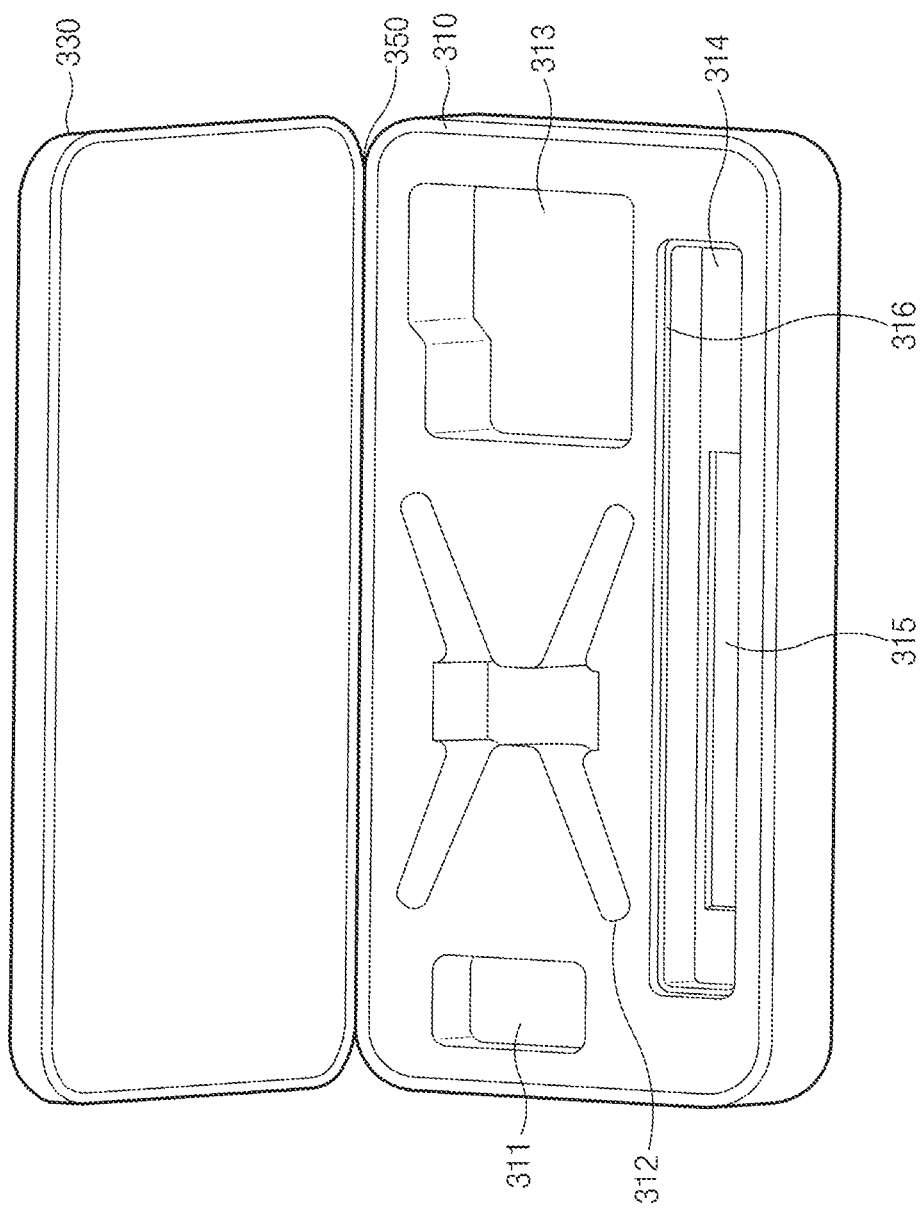
FIG. 3 is a perspective view of a housing of an electronic device according to an embodiment.

FIG. 3 is a perspective view of a housing of an electronic device according to an embodiment.

Referring to FIG. 3, a housing 310 (e.g., the housing 210) may include a seating portion (e.g., a first seating portion 311, a second seating portion 312, or a third seating portion 313) in which a plurality of external electronic devices may be seated. The seating portion may be formed to be recessed or opened in the one side of the housing 210, for example, so as to correspond to the shape of an external electronic device to be seated. As illustrated in the drawing, a plurality of seating portions may be provided, or a single seating portion may be provided to occupy most regions of the one side of the housing 210 such that a plurality of external electronic devices may be seated therein.

According to an embodiment, the housing 310 may secure and support internal components of an electronic device (e.g., the electronic device 100 or 200). For example, the housing 310 may provide a space in which a display, a printed circuit board, an internal battery, or the like may be seated, and may secure and support the seated components. For example, as illustrated, the housing 310 may include a first depression 314 formed to be recessed in one side of the housing 310 such that the internal components may be seated therein. According to an embodiment, the first depression 314 may include a second depression 315 formed to be recessed in one side of the first depression 314 such that at least some of the internal components have a step with the other internal components.

According to an embodiment, the first depression 314 may be fastened to a fixing member (e.g., the fixing member 211) that prevents internal components of the electronic device seated in the first depression 314 from escaping to the outside. As an example, the fixing member may be inserted in a direction in which the first depression 314 is recessed, and may be fastened to the first depression 314. In this case, the first depression 314 may include a support 316 formed such that an outer upper end thereof is jawed to prevent the fixing member from being inserted too deeply into the first depression 314. However, the structure in which the internal components are seated in the housing 310 is not limited thereto. In some embodiments, at least one of the first depression 314, the second depression 315, and the support 316 may be omitted in the housing 310. Alternatively, the housing 310 may be provided such that the internal components may be embedded in the interior of the housing 310 (e.g., a space between the front side and back side of the housing 310) without the first depression 314, the second depression 315, and the support 316.

According to an embodiment, the housing 310 may be fastened to a cover 330 through a hinge member 350. The cover 330 may be pivoted by, for example, the hinge member 350, and may open and close at least one side of the housing 310.

Figure 4:
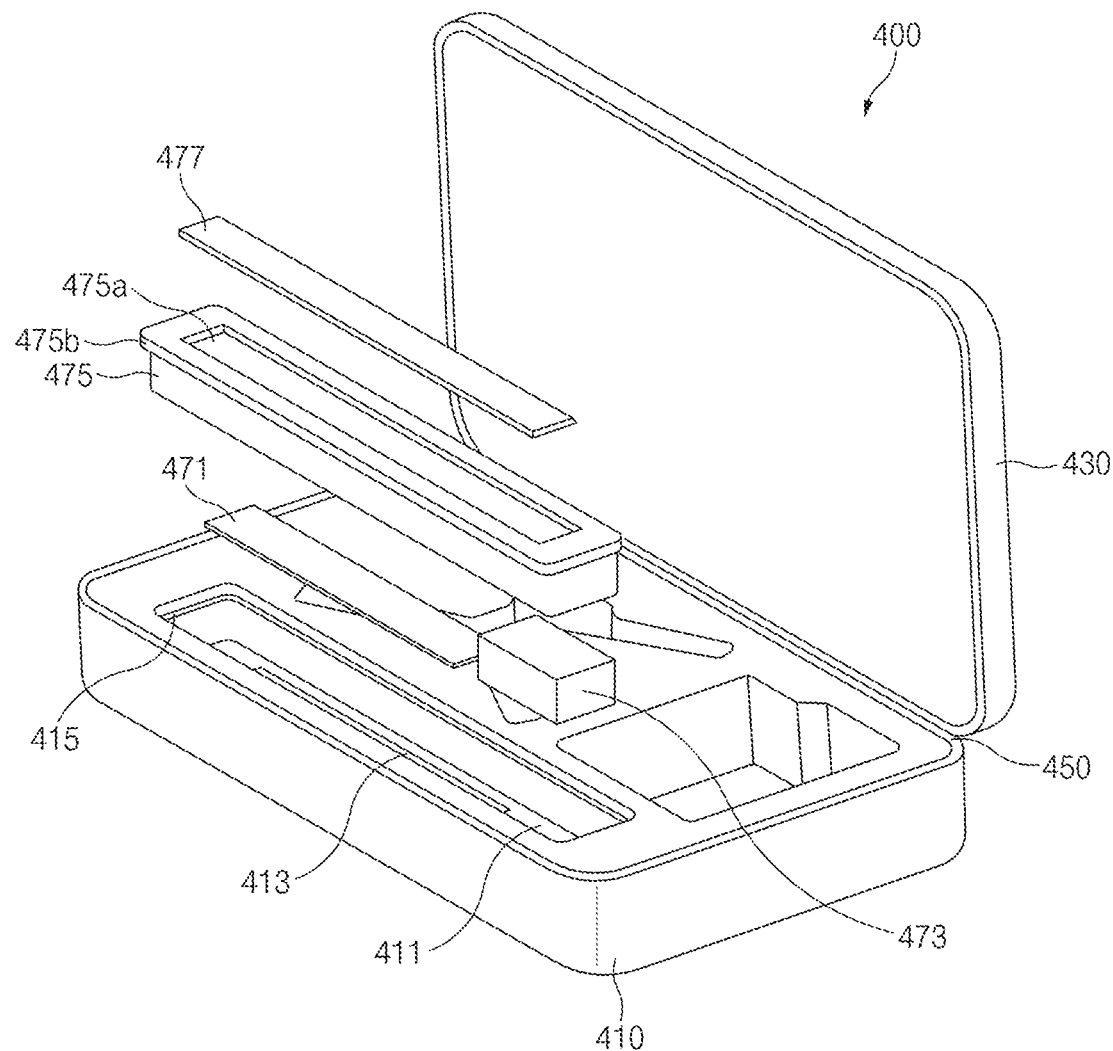
FIG. 4 is an exploded perspective view of an electronic device according to an embodiment.

FIG. 4 is an exploded perspective view of an electronic device according to an embodiment.

Referring to FIG. 4, an electronic device 400 (e.g., the electronic devices 100 or 200) may include a housing 410 (e.g., the housing 310) and a cover 430 (e.g., the cover 350) fastened to the housing 410 through a hinge member 450 (e.g., the hinge member 350). The housing 410 may include a first depression 411 and a second depression 413 in which internal components of the electronic device 400 may be seated.

A printed circuit board 471 and an internal battery 473 may be seated in the first depression 411 and the printed circuit board 471 may be seated in the second depression 413 formed in the first depression 411. The first depression 411 may be fastened to a fixing member 475 that fixes the printed circuit board 471 and the internal battery 473 seated in the first depression 411 so as not to escape to the outside. As an example, the fixing member 475 may be inserted into and fastened to the first depression 411.

According to an embodiment, the fixing member 475 may be formed to have a height of a specified magnitude so as to be inserted into the first depression 411 at a predetermined depth. As an example, the fixing member 475 may be provided to have the shape of a circular column or a polygonal column (e.g., a rectangular column) having the height of the specified magnitude. In addition, the fixing member 475 may include a protrusion 475b that prevents the fixing member 475 from being inserted too deeply into the first depression 411. The protrusion 475b may be formed in an outer upper end of the fixing member 475. In this case, when the fixing member 475 is inserted into the first depression 411 at a predetermined depth, the protrusion 475b may be latched and supported by a support 415 formed to be stepped in the outer upper end of the first depression 411.

According to an embodiment, the fixing member 475 may provide a space in which a display 477 may be seated and fixed. For example, the fixing member 475 may include a third depression 475a that is recessed inwardly from one side thereof. The display 477 may be inserted into and fixed to the third depression 475a through an adhesive member or the like.

Various electronic parts may be mounted on the printed circuit board 471. For example, at least one electronic element, a circuit line, or the like may be mounted on the printed circuit board 471, and at least some of them may be electrically connected to each other. The electronic parts may include, for example, a processor (e.g., the processor 130), a memory, or a communication module (e.g., a communication circuit). Although the electronic device 400 is illustrated as including a single printed circuit board 471 alone in the drawing, it is not limited thereto. According to various embodiments, the electronic device 400 may include a plurality of printed circuit boards.

Figure 5A:
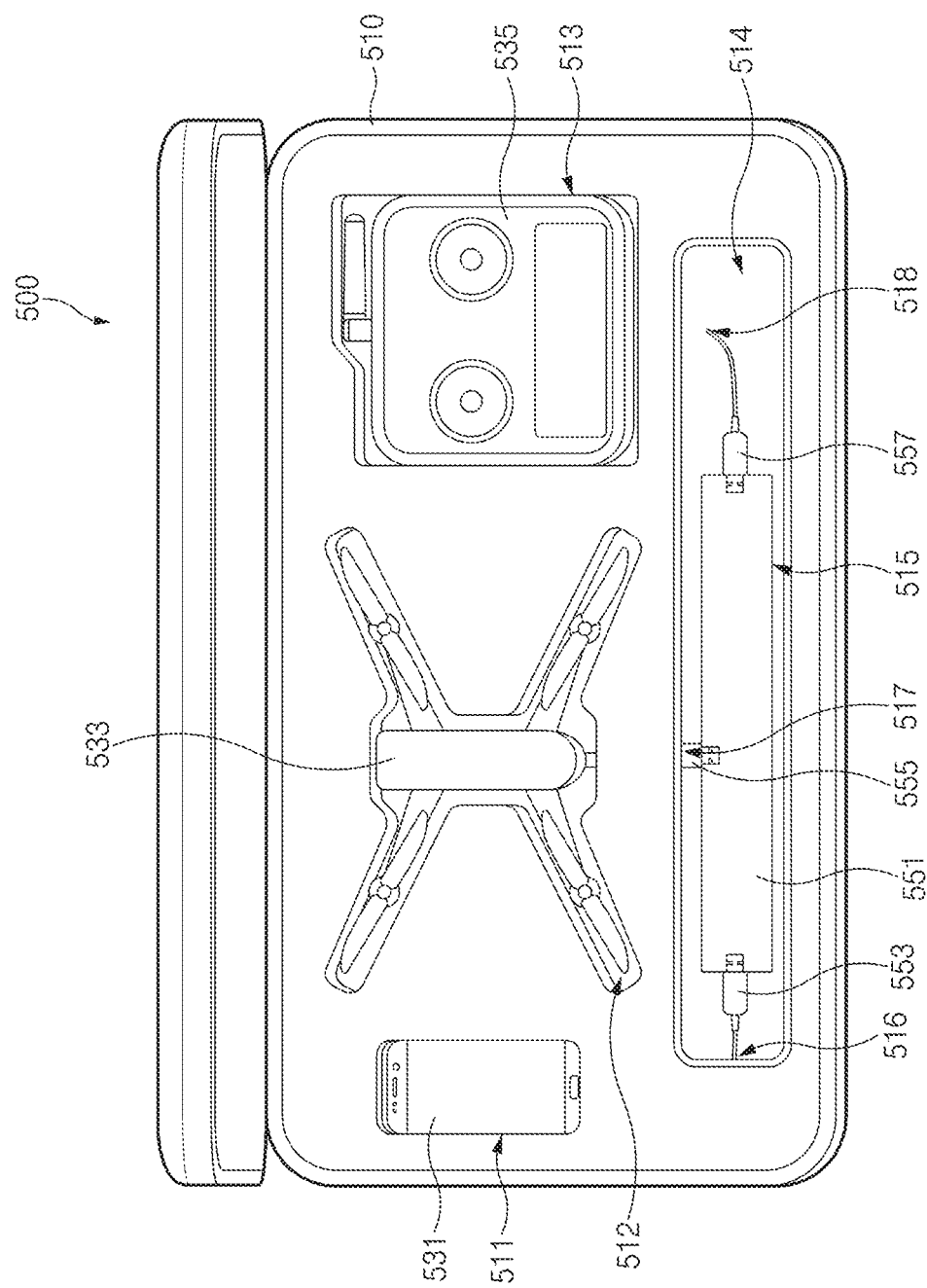
FIG. 5a is a plan view of an electronic device for describing a connection state with a plurality of external electronic devices according to an embodiment.
Figure 5B:
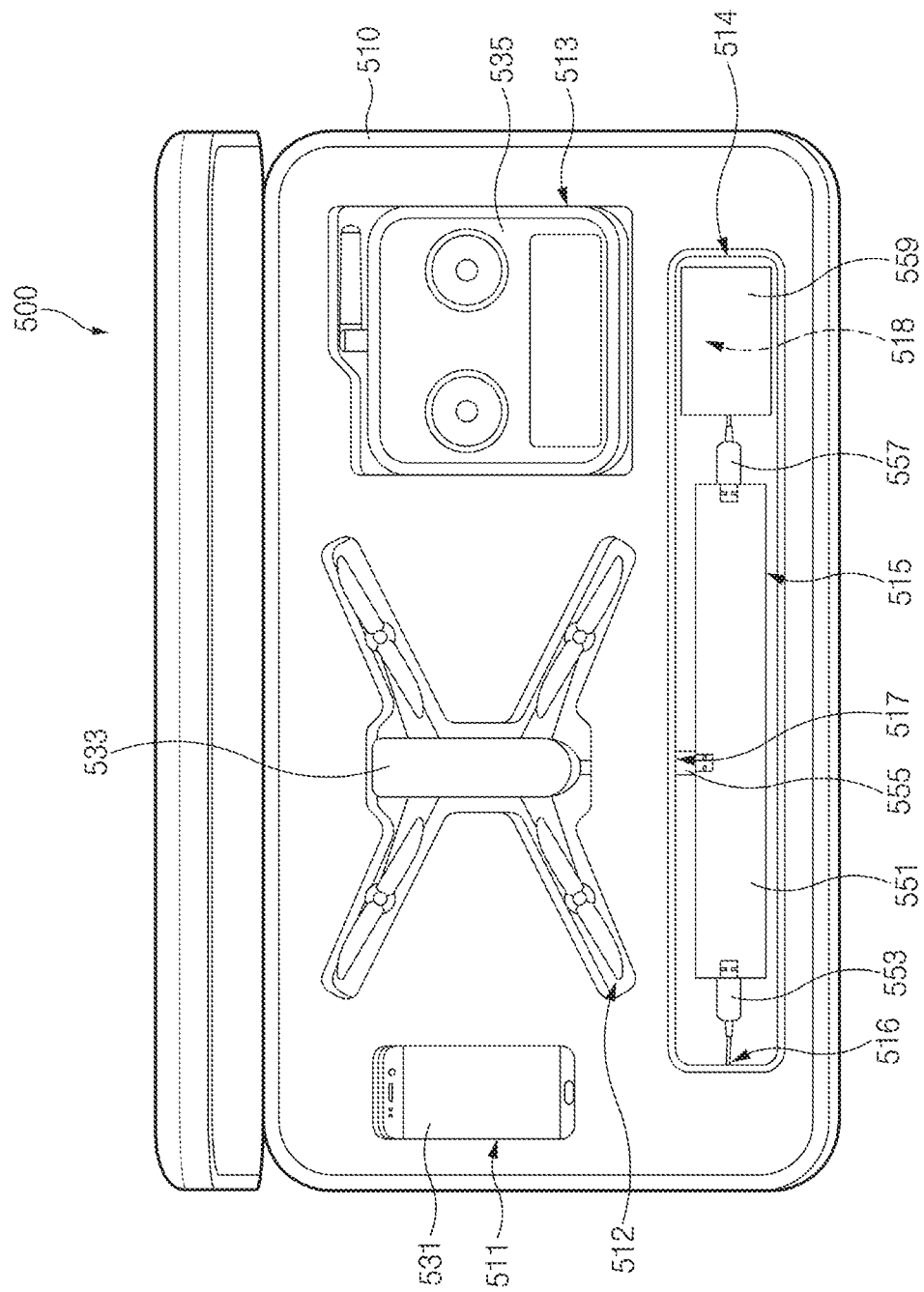
FIG. 5b is a view of an electronic device in which an internal battery is seated according to an embodiment.

FIG. 5a is a plan view of an electronic device for describing a connection state with a plurality of external electronic devices according to an embodiment, and FIG. 5b is a view of an electronic device in which an internal battery is seated according to an embodiment.

Referring to FIGS. 5a and 5b, an electronic device 500 may include a housing 510. The housing 510 may include a seating portion in which a plurality of external electronic devices (e.g., a first external electronic device 531, a second external electronic device 533, or a third external electronic device 535) may be seated. In the drawing, there is illustrated that the first external electronic device 531, the second external electronic device 533, and the third external electronic device 535 are respectively seated in a first seating portion 511, a second seating portion 512, and a third seating portion 513.

In addition, the housing 510 may include a depression in which internal components of the electronic device 500 may be seated. The depression may be formed to be opened or recessed in one side of the housing 510, or may be formed to be stepped to have a stepped portion. For example, a first depression 514 may be formed to be recessed to a first depth in a first region having a specified length and width in a front side of the housing 510 and a second depression 515 may be formed to be recessed to a second depth larger than the first depth in a second region within the first region. According to an embodiment, a printed circuit board 551 and an internal battery 559 may be seated in the first depression 514 and further the printed circuit board 551 may be seated in the second depression 515.

According to an embodiment, the printed circuit board 551 and/or the internal battery 559 may be electrically connected to the external electronic devices through an interface. As illustrated in the drawing, the printed circuit board 551 and/or the internal battery 559 may be connected to the first external electronic device 531 through a first interface 553, to the second external electronic device 533 through a second interface 555, and to the third external electronic device 535 through a third interface 557.

According to an embodiment, the interface may be connected to the external electronic devices through a hole formed in one side of the first depression 514 or the second depression 515. The hole may elongate to one side of the seating portion, and the interface may be inserted into the hole so that one end thereof may be connected to the printed circuit board 551 and/or the internal battery 559 and the other end may be connected to the external electronic devices. In the drawing, there is illustrated that the first interface 553 is connected to the first external electronic device 531 through a first hole 516 formed in the left side of the first depression 514, the second interface 555 is connected to the second external electronic device 533 through a second hole 517 formed in the upper side of the first depression 514, and the third interface 557 is connected to the third external electronic device 535 through a third hole 518 formed in the lower side of the first depression 514.

Figure 6A:
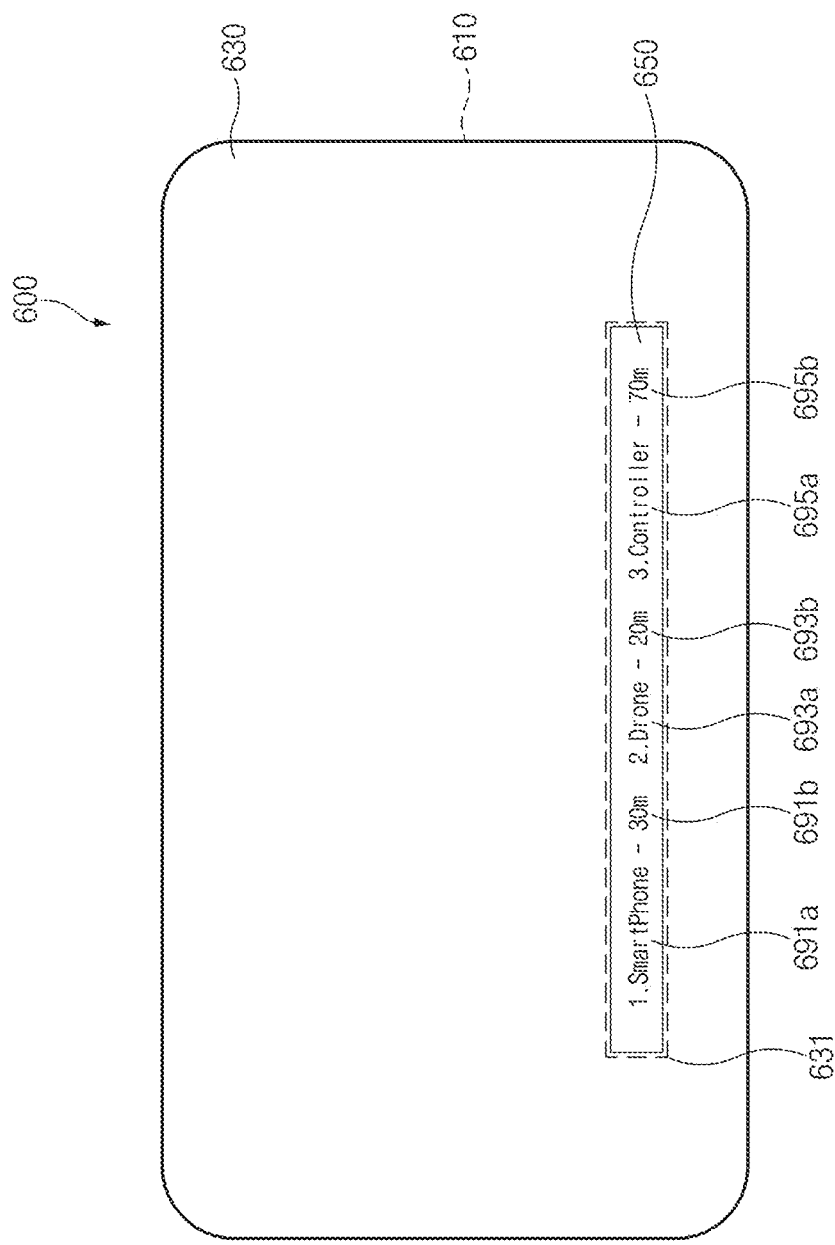
FIG. 6a is a diagram for describing a method of displaying remaining battery times of a plurality of external electronic devices in a state in which a cover is closed according to an embodiment.
Figure 6B:
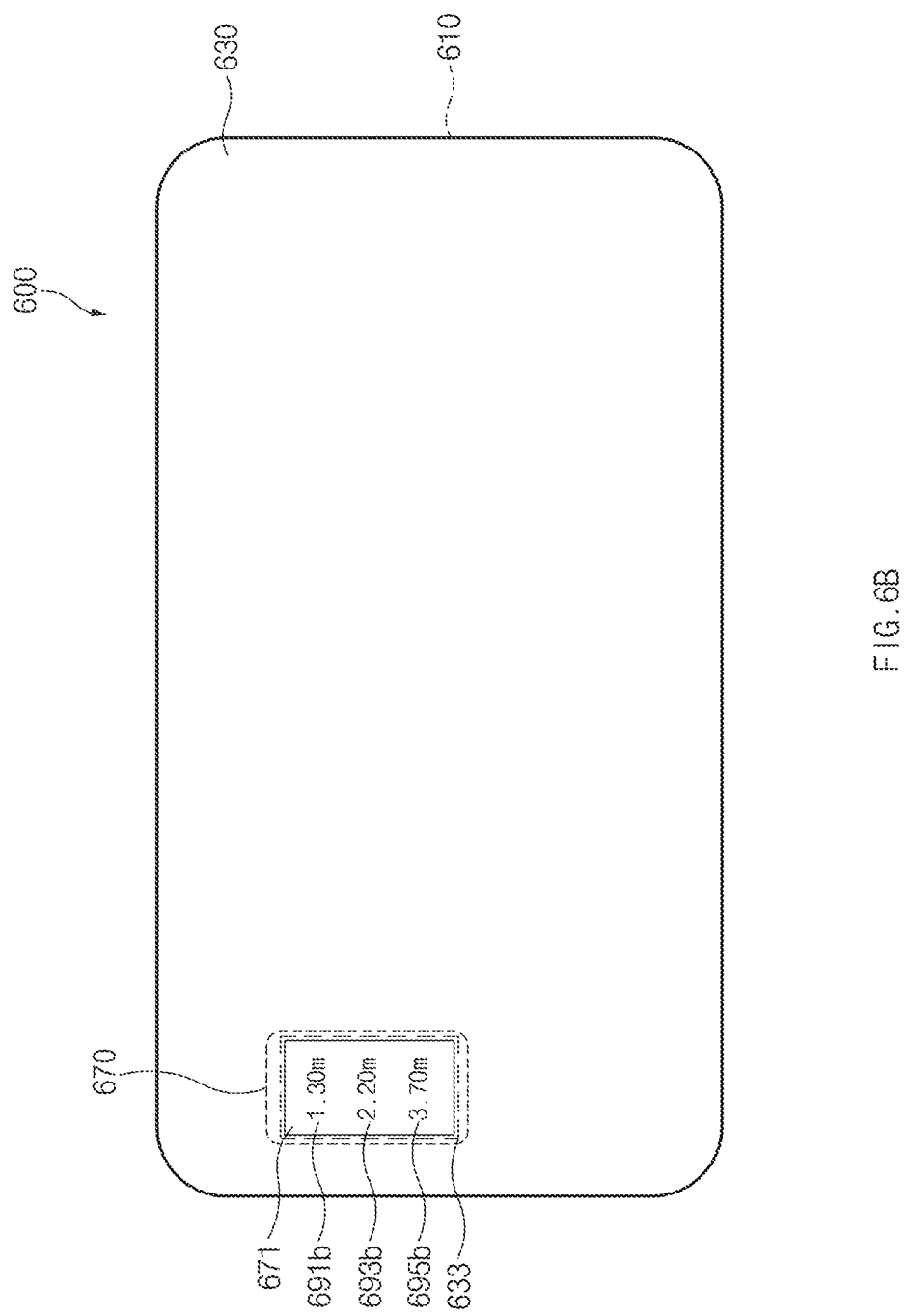
FIG. 6b is a diagram for describing another method of displaying remaining battery times of a plurality of external electronic devices in a state in which a cover is closed, according to an embodiment.

FIG. 6*a* is a diagram for describing a method of displaying remaining battery times of a plurality of external electronic devices in a state in which a cover is closed according to an embodiment, and FIG. 6*b* is a diagram for describing another method of displaying remaining battery times of a plurality of external electronic devices in a state in which a cover is closed, according to an embodiment.

Referring to FIGS. 6*a* and 6*b*, an electronic device 600 (e.g., the electronic device 100, 200 or 500) may display information on remaining battery times of a plurality of external electronic devices which are seated in a housing 610, through a display 650. According to an embodiment, the display 650 may be disposed on one side of the housing 610. In addition, the one side of the housing 610 on which the display 650 is disposed may be opened and closed by a cover 630.

According to an embodiment, the cover 630 may be provided to have a partial region formed to be transparent such that a screen of the display 650 is exposed to the outside even when the one surface of the housing 610 on which the display 650 is disposed is covered by the cover 630. For example, as illustrated in FIG. 6*a*, a region 631 of the cover 630 facing the display 650 in a state where the cover 630 is closed may include a transparent material.

According to an embodiment, when there is an external electronic device 670 including a display 671 among the external electronic devices seated in the housing 610, the electronic device 600 may output information on the remaining battery times of batteries of the external electronic devices through the display 671 of the external electronic device 670. In this case, as illustrated in FIG. 6*b*, a region 633 of the cover 630 facing the display 671 of the external electronic device 670 in a state where the cover 630 is closed may include a transparent material.

According to an embodiment, the electronic device 600 may differently set output information according to a size (or resolution) of a screen of a display (e.g., the display 650 or the display 671 of the external electronic device 670). For example, the electronic device 600 may display information on the remaining battery times of the external electronic devices along with identification information of the external electronic devices (e.g., a type, product name, or product number of an electronic device) when the screen of the display is equal to or larger than a specified size, and display only the information on the remaining battery times of the external electronic devices when the screen of the display is smaller than the specified size. As an example, as illustrated in FIG. 6*a*, the electronic device 600 may display, through the display 650 included in the electronic device 600, identification information 691*a* of the first external electronic device, identification information 693*a* of the second external electronic device, and identification information 695*a* of the third external electronic device along with remaining battery time information 691*b* of the first external electronic device, remaining battery time information 693*b* of the second external electronic device, and remaining battery time information 695*b* of the third external electronic device respectively. As another example, as illustrated in FIG. 6*b*, the electronic device 600 may display the remaining battery time information 691*b* of the first external electronic device, the remaining battery time information 693*b* of the second external electronic device, and the remaining battery time information 695*b* of the third external electronic device, through the display 671 included in the external electronic device 670 (e.g., the first external electronic device, the second external electronic device, or the third external electronic device)

Figure 7:
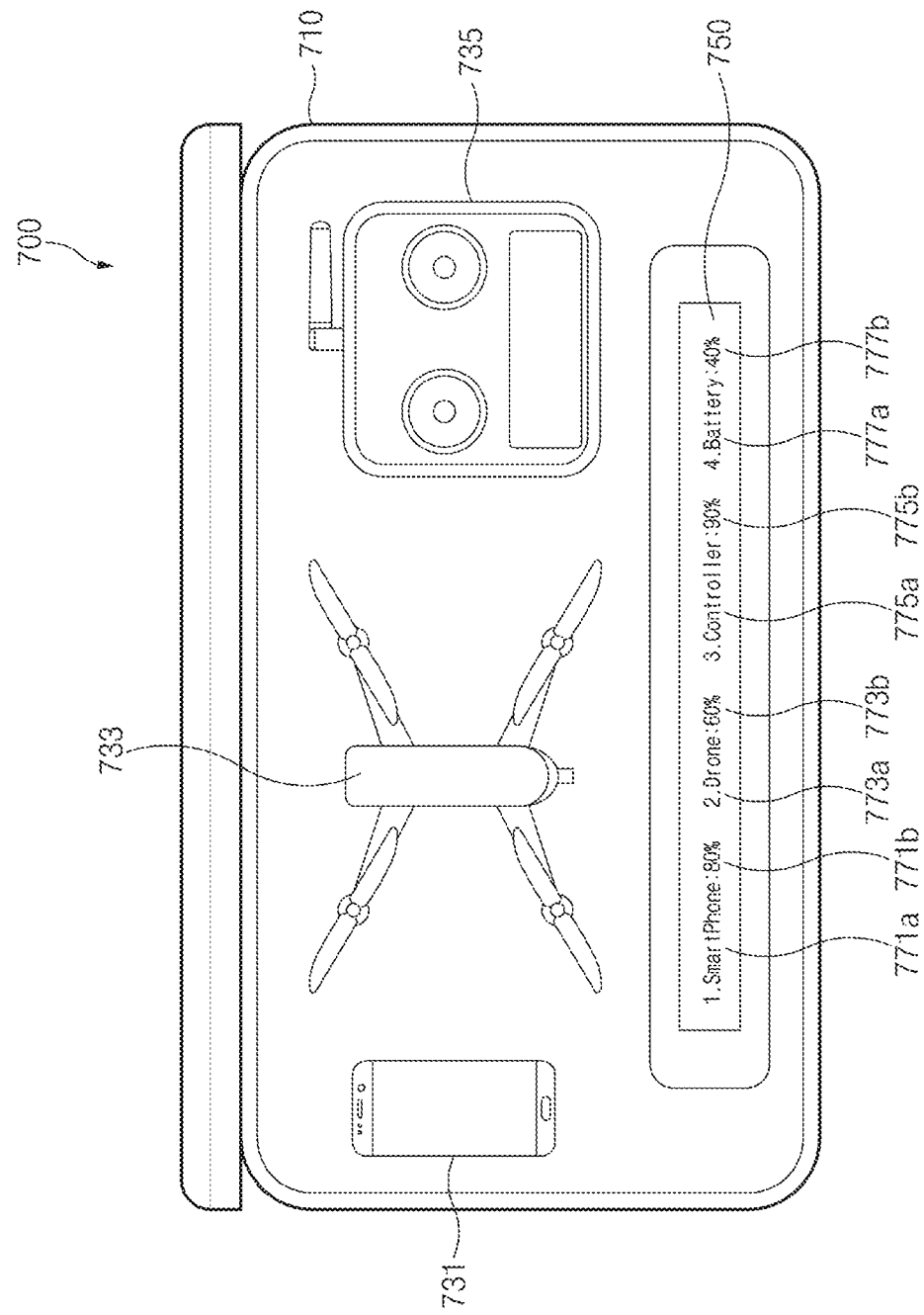
FIG. 7 is a diagram for describing a method of displaying remaining battery percentages of a plurality of external electronic devices, according to an embodiment.

FIG. 7 is a diagram for describing a method of displaying remaining battery percentages of a plurality of external electronic devices, according to an embodiment.

Referring to FIG. 7, an electronic device 700 (e.g., the electronic device 100, 200, 500, or 600) may display information on remaining battery percentages of a plurality of external electronic devices seated in a housing 710 through a display 750. For example, the electronic device 700 may output, through the display 750, remaining battery percentage information 771*b* of a first external electronic device 731, remaining battery percentage information 773*b* of a second external electronic device 733, and remaining battery percentage information 775*b* of a third external electronic device 735, along with identification information 771*a* of the first external electronic device 731, identification information 773*a* of the second external electronic device, 733 and the identification information 775*a* of the third external electronic device 735. In some embodiments, the electronic device 700 may output identification information 777*a* of an internal battery and remaining battery percentage information 777*b* of the internal battery through the display 750.

Figure 8:
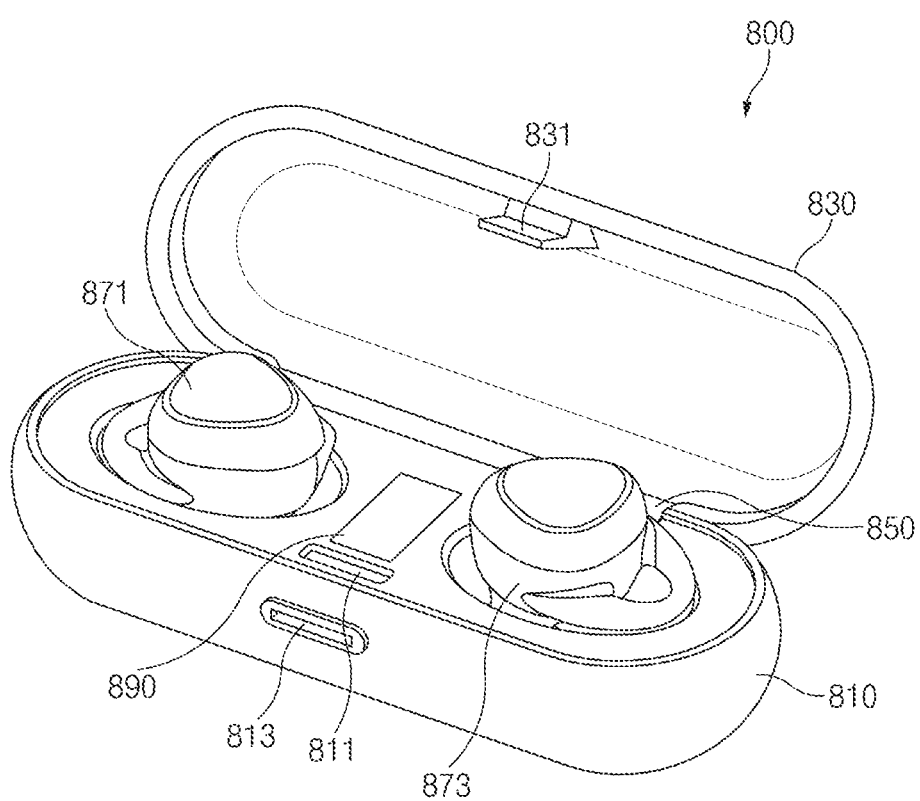
FIG. 8 is a perspective view of an electronic device in which a plurality of external electronic device are accommodated.
Figure 9:
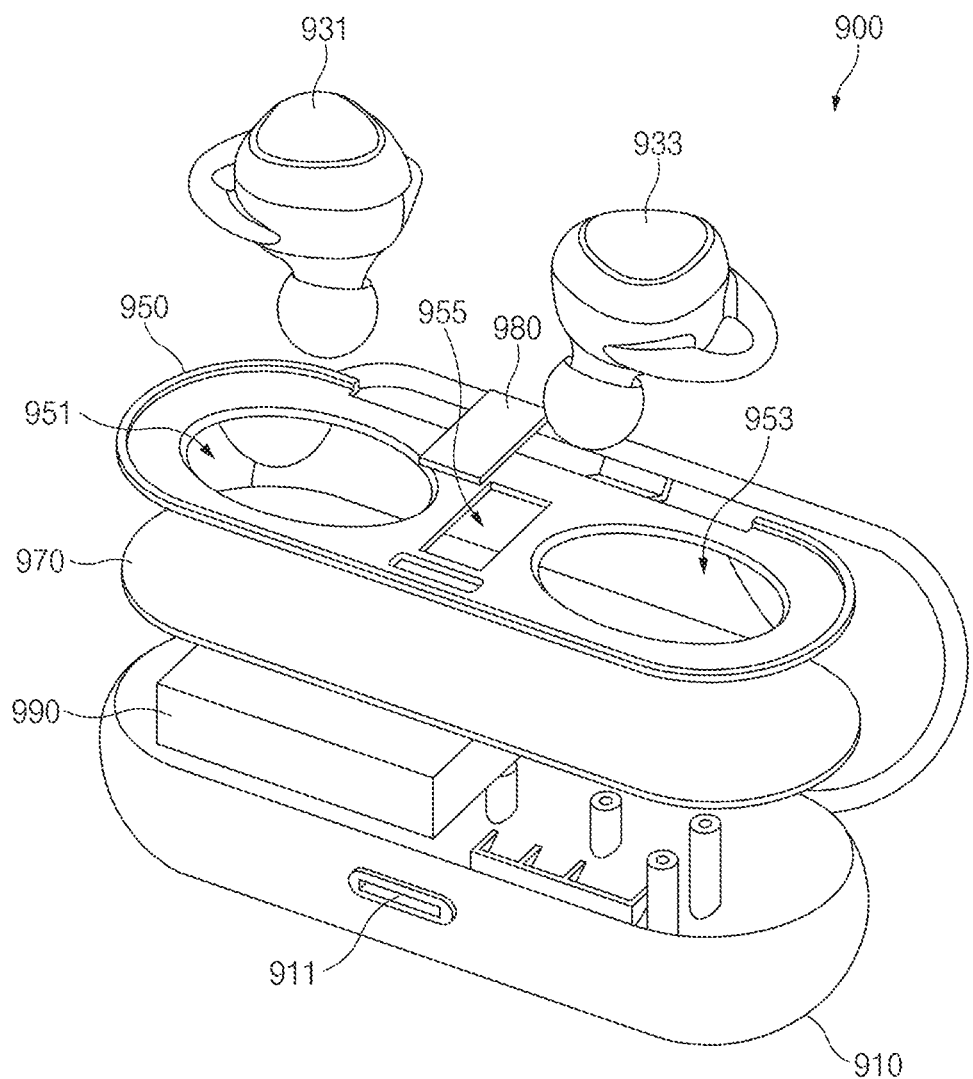
FIG. 9 is an exploded perspective view of the electronic device of FIG. 8, according to an embodiment.

FIG. 8 is a perspective view of an electronic device in which a plurality of external electronic device are accommodated, and FIG. 9 is an exploded perspective view of the electronic device of FIG. 8, according to an embodiment.

Referring to FIGS. 8 and 9, each of electronic devices 800 and 900 (e.g., the electronic device 100) may accommodate external electronic devices (e.g., a wireless headset or wireless earphones) which are provided as a set, and manage power of batteries of the external electronic devices such that the remaining battery times of the external electronic devices are substantially equal to each other.

According to an embodiment, a housing 810 or 910 of the electronic device 800 or 900 may include a seating portion 950 in which a first external electronic device 871 or 931 (e.g., a left earphone) and a second external electronic device 873 or 933 (e.g., a right earphone), which are provided as a pair, are seated. The seating portion 950 may include a first opening 951, in which the first external electronic device 871 or 931 is seated, in a left region and a second opening 953, in which the second external electronic device 873 or 933 is seated, in a right region. The first opening 951 and the second opening 953 may be formed to respectively correspond to shapes of the first external electronic device 871 or 931 and the second external electronic device 873 or 933. For example, the first opening 951 may be formed to correspond to the shape of the first external electronic device 871 or 931 when the first external electronic device 871 or 931 is viewed from above (or below), and the second opening 953 may be formed to correspond to the shape of the second external electronic device 873 or 933 when the second external electronic device 873 or 933 is viewed from above (or below).

According to an embodiment, the electronic device 800 or 900 may include a display 890 or 980 capable of outputting information on remaining battery times of the external electronic devices, or the like. As an example, the seating portion 950 may include a third opening 955 such that the display 890 or 980 is seated between the first opening 951 and the second opening 953. The display 890 or 980 may be seated in the third opening 955 and electrically connected to a printed circuit board 970.

The printed circuit board 970 may be disposed under the seating portion 950. For example, when the printed circuit board 970 is seated in the housing 910, the seating portion 950 may be disposed on the printed circuit board 970 so as to cover the printed circuit board 970. Various electronic parts may be mounted on the printed circuit board 970. For example, at least one electronic element, a circuit line or the like may be mounted on the printed circuit board 970, and at least some of them may be electrically connected to each other. The electronic parts may include, for example, a processor (and/or a power management module), a memory, or a communication module (e.g., communication circuit).

The electronic device 800 or 900 may include an internal battery 990. The internal battery 990 may supply power to components of the electronic device 800 or 900 and supply power to batteries of the external electronic devices. According to an embodiment, the internal battery 990 may be seated in the housing 910 and disposed under the printed circuit board 970.

According to an embodiment, the electronic device 800 or 900 may provide an interface through which an external power supply may be connected. As an example, an interface 813 or 911 capable of being connected to the external power supply may be disposed in a side of the housing 810 or 910.

According to an embodiment, the housing 810 or 910 may be connected to a cover 830 through a hinge member 850. The cover 830 may be pivoted to open or close one side of the housing 810 or 910. When the cover 830 covers the one side of the housing 810 or 910, a latch portion 831 protruding from an inner surface of the cover 830 is inserted into and latched in a fourth opening 811 formed in the seating portion 950. According to an embodiment, in a case where the external electronic device is electrically connected to a contact part disposed in one side of the housing 810 or 910, when the cover 830 is closed, the cover 830 may pressurize the external electronic device, allowing the contact part to be stably electrically connected to the external electronic device.

Figure 10:
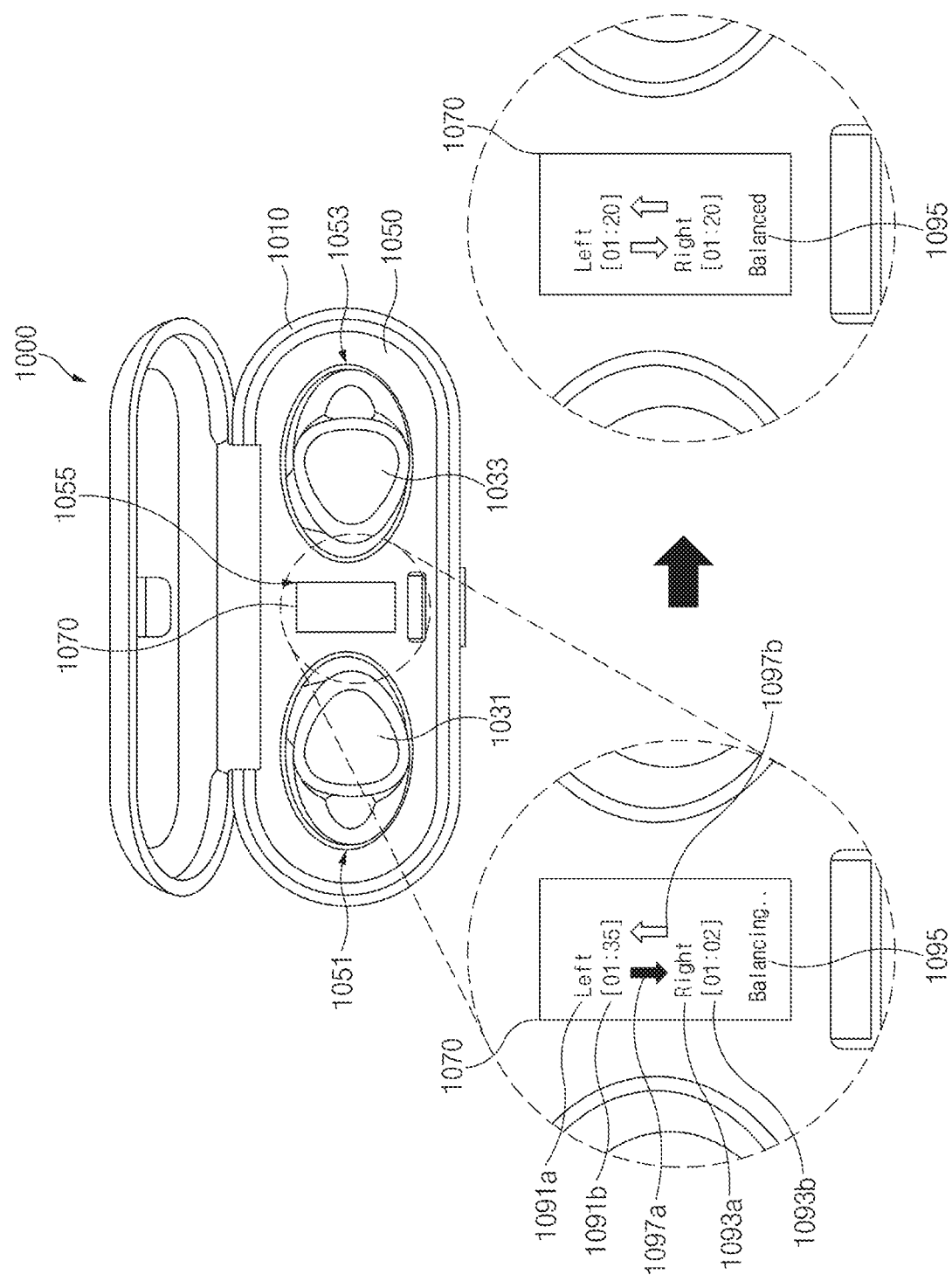
FIG. 10 is a diagram for describing a method of sharing battery power between a plurality of external electronic devices according to an embodiment.

FIG. 10 is a diagram for describing a method of sharing battery power between a plurality of external electronic devices according to an embodiment.

Referring to FIG. 10, an electronic device 1000 (e.g., the electronic device 800 or 900) may include a seating portion 1050 disposed on one surface of a housing 1010 and provided so as for a first external electronic device 1031 and a second external electronic device 1033 to be seated therein. The seating portion 1050 may include a first opening 1051 and a second opening 1053 such that the first external electronic device 1031 and the second external electronic device 1033 are respectively seated therein. In addition, the electronic device 1000 may include a display 1070 for displaying status information indicating that the battery power is shared between the first external electronic device 1031 and the second external electronic device 1033. As an example, the display 1070 may be inserted into and fixed in a third opening 1055 formed in the seating portion 1050.

According to an embodiment, the electronic device 1000 may allow battery power of the first external electronic device 1031 and the second external electronic device 1031 to be shared with each other when no power remains in an internal battery (e.g., the internal battery 990) or no external power is applied. As an example, the electronic device 1000 may supply power of a battery of an external electronic device having a relatively long remaining battery time to a battery of another external electronic device.

As illustrated in the lower left portion of the drawing, when the remaining battery time of the first external electronic device 1031 is relatively long, the power of the battery of the first external electronic device 1031 may be supplied to the battery of the second external electronic device 1033, thereby causing the remaining battery times to be substantially equal to each other as illustrated in the lower right portion of the drawing.

According to an embodiment, the electronic device 1000 may display, through the display 1070, identification information 1091a of the first external electronic device 1031, remaining battery time information 1091b of the first external electronic device 1031, identification information 1093a of the second external electronic device 1033, and remaining battery time information 1093b of the second external electronic device 1033. In addition, the electronic device 1000 may further display, through the display 1070, information 1095 indicating a sharing state of battery power, information indicating a direction in which the battery power is shared (e.g., information 1097a indicating that power is supplied from the battery of the first external electronic device 1031 to the battery of the second external electronic device 1033 and information 1097b indicating that power is supplied from the battery of the second external electronic device 1033 to the battery of the first external electronic device 1031), or the like.

Figure 11:
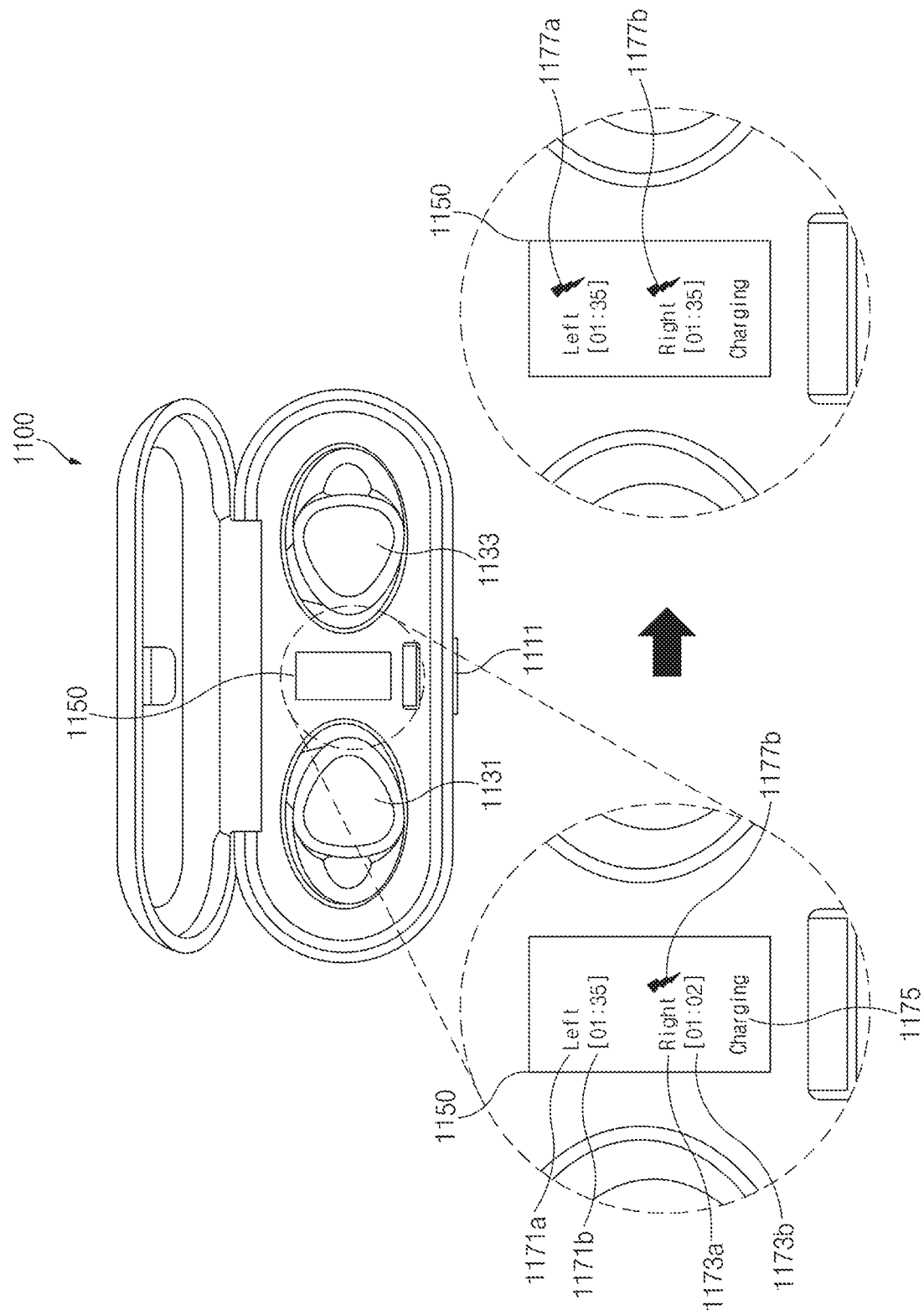
FIG. 11 is a diagram for describing a method of charging batteries of a plurality of external electronic devices in a state where external power is applied, according to an embodiment.

FIG. 11 is a diagram for describing a method of charging batteries of a plurality of external electronic devices in a state where external power is applied, according to an embodiment.

Referring to FIG. 11, an electronic device 1100 (e.g., the electronic device 800, 900 or 1000) may charge at least one of a battery of a first external electronic device 1131, a battery of a second external electronic device 1133, and an internal battery (e.g., the internal battery 990) when external power is applied through an interface 1111 disposed in one side of a housing (e.g., the housing 1010).

According to an embodiment, as illustrated in the lower left portion of the drawing, the electronic device 1100 may compare a remaining battery time of the first external electronic device 1131 with a remaining battery time of the second external electronic device 1133 and first charge a battery of an external electronic device of which the remaining battery time is relatively short. Alternatively, the electronic device 1100 may supply a first amount of current to a battery of an external electronic device having a relatively short remaining battery time, and a second amount of current, which is smaller than the first amount of current, to a battery of the external electronic device having a relatively long remaining battery time. As illustrated in the lower right portion of the drawing, when the remaining battery times of the first external electronic device 1131 and the second external electronic device 1133 are substantially equal to each other, the electronic device 1100 may charge the battery of the first external electronic device 1131 and the battery of the second external electronic device 1133 together.

According to an embodiment, the electronic device 1100 may display, through a display 1150, identification information 1171a of the first external electronic device 1131, remaining battery time information 1171b of the first external electronic device 1131, identification information 1173a of the second external electronic device 1133, and remaining battery time information 1173b of the second external electronic device 1133. In addition, the electronic device 1100 may further display, through the display 1150, information 1175 indicating a charge amount of a battery, information indicating whether a battery is charged (e.g., information 1177a indicating that a battery of the first external electronic device 1131 is being charged and information 1177b indicating that a battery of the second external electronic device 1133 is being charged), or the like.

Figure 12:
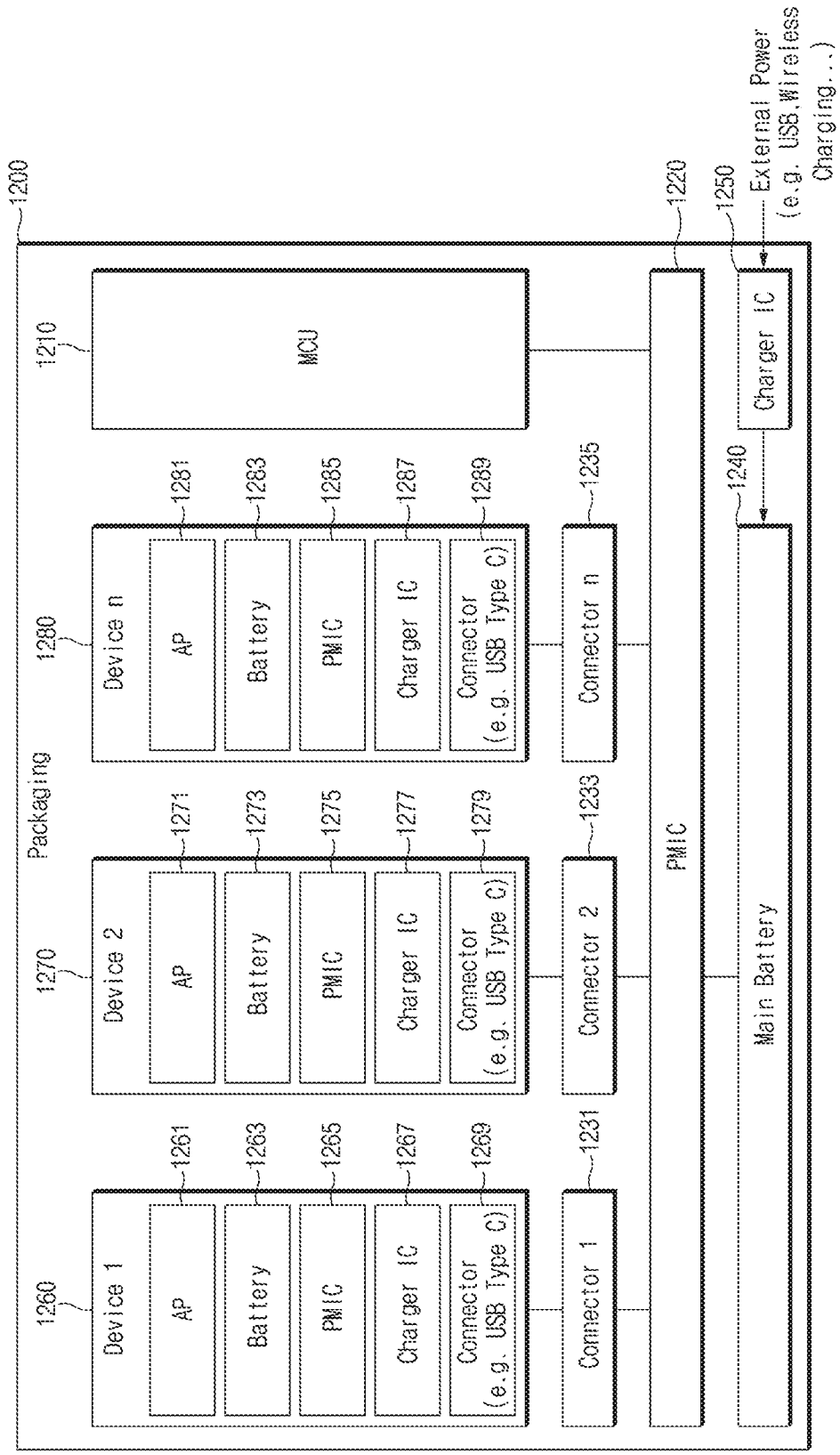
FIG. 12 is a block diagram of an electronic device for managing power of batteries of a plurality of external electronic devices, according to an embodiment.

FIG. 12 is a block diagram of an electronic device for managing power of batteries of a plurality of external electronic devices, according to an embodiment.

Referring to FIG. 12, an electronic device 1200 (e.g., the electronic device 100) may be provided in the form of a package capable of accommodating (or receiving) a plurality of external electronic devices (e.g., a first external electronic device 1260, a second external electronic device 1270, and an n-th external electronic device 1280). The electronic device 1200 may include an internal circuit capable of controlling power of the external electronic devices (managing battery power). The internal circuit may include, for example, a processor 1210 (e.g., an MCU), a power management module (PMIC) 1220, or a charger IC 1250.

Each of the external electronic devices may include an interface for external connection, such as a connector (e.g., USB Type-C), a charger circuit for charging, a power management module for power control, a battery, and a processor (e.g., AP). For example, the first external electronic device 1260 may include a first connector 1269, a first charger circuit 1267, a first power management module 1265, a first battery 1263, and a first processor 1261, the second external electronic device 1270 may include a second connector 1279, a second charger circuit 1277, a second power management module 1275, a second battery 1273, and a second processor 1271, and the n-th external electronic device 1280 may include an n-th connector 1289, an n-th charger circuit 1287, an n-th power management module 1285, an n-th battery 1283, and an n-th processor 1281. In addition, each of the external electronic devices may be connected to an interface included in the electronic device 1200, for example, a connector (e.g., a fourth connector 1231, a fifth connector 1233, and a sixth connector 1235).

According to an embodiment, the electronic device 1200 may include an internal battery 1240. The internal battery 1240 may be charged when external power is applied.

As described above, according to various embodiments, an electronic device (e.g., the electronic device 100, 400, 500, 600 or 1200) may include a housing (e.g., the housing 510), a seating portion (e.g., the first seating portion 511, the second seating portion 512, or the third searing portion 513) that is formed in the housing, the first external electronic device and the second external electronic device being seated in the seating portion, at least one interface (e.g., the first interface 553, the second interface 555, or the third interface 557) that is electrically connected to the first external electronic device and the second external electronic device to transmit and receive power, and a processor (e.g., the processor 130) that is electrically connected to the at least one interface, wherein the processor may obtain a first remaining battery time of a first battery included in the first external electronic device connected through the at least one interface, obtain a second remaining battery time of a second battery included in the second external electronic device connected through the at least one interface, and manage power of at least one of the first battery and the second battery such that the first remaining battery time of the first battery and the second remaining battery time of the second battery are substantially equal to each other.

According to various embodiments, the processor may obtain a first remaining battery capacity of the first battery and calculate the first remaining battery time of the first battery based on the first remaining battery capacity of the first battery, as at least a part of operation of obtaining the first remaining battery time of the first battery, and obtain a second remaining battery capacity of the second battery and calculate the second remaining battery time of the second battery based on the second remaining battery capacity of the second battery, as at least a part of operation of obtaining the second remaining battery time of the second battery.

According to various embodiments, the processor may supply power of the second battery to the first battery when the first remaining battery time of the first battery is smaller than the second remaining battery time of the second battery, as at least a part of operation of managing the power of the at least one of the first battery and the second battery.

According to various embodiments, the electronic device may further include an internal battery (e.g., the battery 559) electrically connected to the processor, and the processor may set at least one of orders of supplying power to the first battery and the second battery from the internal battery and amounts of supply power based on the first remaining battery time of the first battery and the second remaining battery time of the second battery, as at least a part of operation of managing the power of the at least one of the first battery and the second battery.

According to various embodiments, the electronic device may further include a charger circuit (e.g., the charger circuit 1250) that receives power from an external power supply, and the processor may set at least one of orders of supplying power to the first battery and the second battery from the external power supply and amounts of supply power based on the first remaining battery time of the first battery and the second remaining battery time of the second battery when receiving power from the external power supply through the charger circuit, as at least a part of operation of managing the power of the at least one of the first battery and the second battery.

According to various embodiments, the electronic device may further include a display (e.g., the display 650) exposed to outside of the housing, and the processor may display at least one of the first remaining battery time of the first battery and the second remaining battery time of the second battery through the display.

According to various embodiments, when the first external electronic device includes a display (e.g., the display 671), the processor may display at least one of the first remaining battery time of the first battery and the second remaining battery time of the second battery through the display of the first external electronic device.

According to various embodiments, the electronic device may further include a cover (e.g., the cover 430) that covers at least one side of the housing.

According to various embodiments, at least a partial region of the cover may be transparent.

According to various embodiments, the first external electronic device may be an unmanned aerial vehicle and the second external electronic device may be a controller of the unmanned aerial vehicle.

According to various embodiments, the first external electronic device and the second external electronic device may be wireless headsets or wireless earphones.

Figure 13:
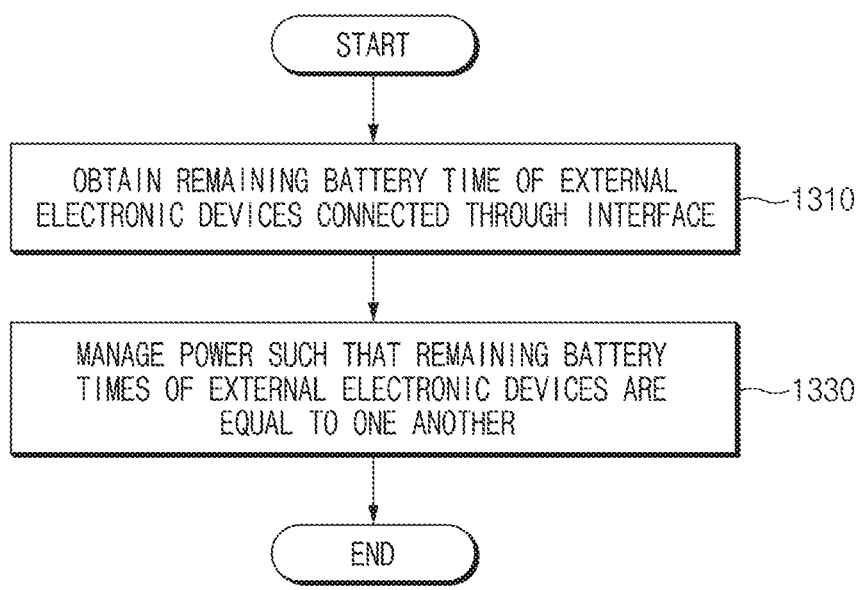
FIG. 13 is a diagram of describing an operation method of an electronic device related to a power management function according to an embodiment.

FIG. 13 is a diagram of describing an operation method of an electronic device related to a power management function according to an embodiment.

Referring to FIG. 13, an electronic device (e.g., the electronic device 100 or 1200) may, in operation 1310, obtain remaining battery times of external electronic devices connected through an interface. According to an embodiment, the electronic device may receive information on the remaining battery time from each of the external electronic devices through the interface. In addition, the electronic device may receive information on a remaining battery capacity or a remaining battery percentage while receiving the remaining battery time. In some embodiments, the electronic device may obtain information on current consumption per hour of the battery from the external electronic devices, and calculate the remaining battery times of the external electronic devices by using the obtained current consumption per hour and remaining battery capabilities.

When obtaining the remaining battery times of the external electronic devices, the electronic device may compare the obtained remaining battery times with one another. In operation 1330, the electronic device may manage power of the batteries of the external electronic devices such that the remaining battery times of the external electronic devices are substantially equal to one another, based on a result of comparison of the remaining battery times. As an example, the electronic device may share power of a battery of a first external electronic device having a relatively long remaining battery time among the external electronic devices with a second external electronic device. As another example, when power of the internal battery remains or external power is applied, the electronic device may first charge the second external electronic device having a relatively short remaining battery time, among the external electronic devices. As still another example, the electronic device may set charge amounts for the batteries of the external electronic devices to be different from one another, based on the remaining battery times of the external electronic devices.

According to an embodiment, when the sum of the amounts of charge power of the batteries of the external electronic devices is smaller than the amount of supply power (e.g., of the internal battery or the external power supply) applied to the electronic device, the electronic device may simultaneously charge the batteries of the external electronic devices. As still another example, when the sum of the amounts of charge power is larger than the supply power, the electronic device may selectively charge the batteries of the external electronic devices.

Figure 14:
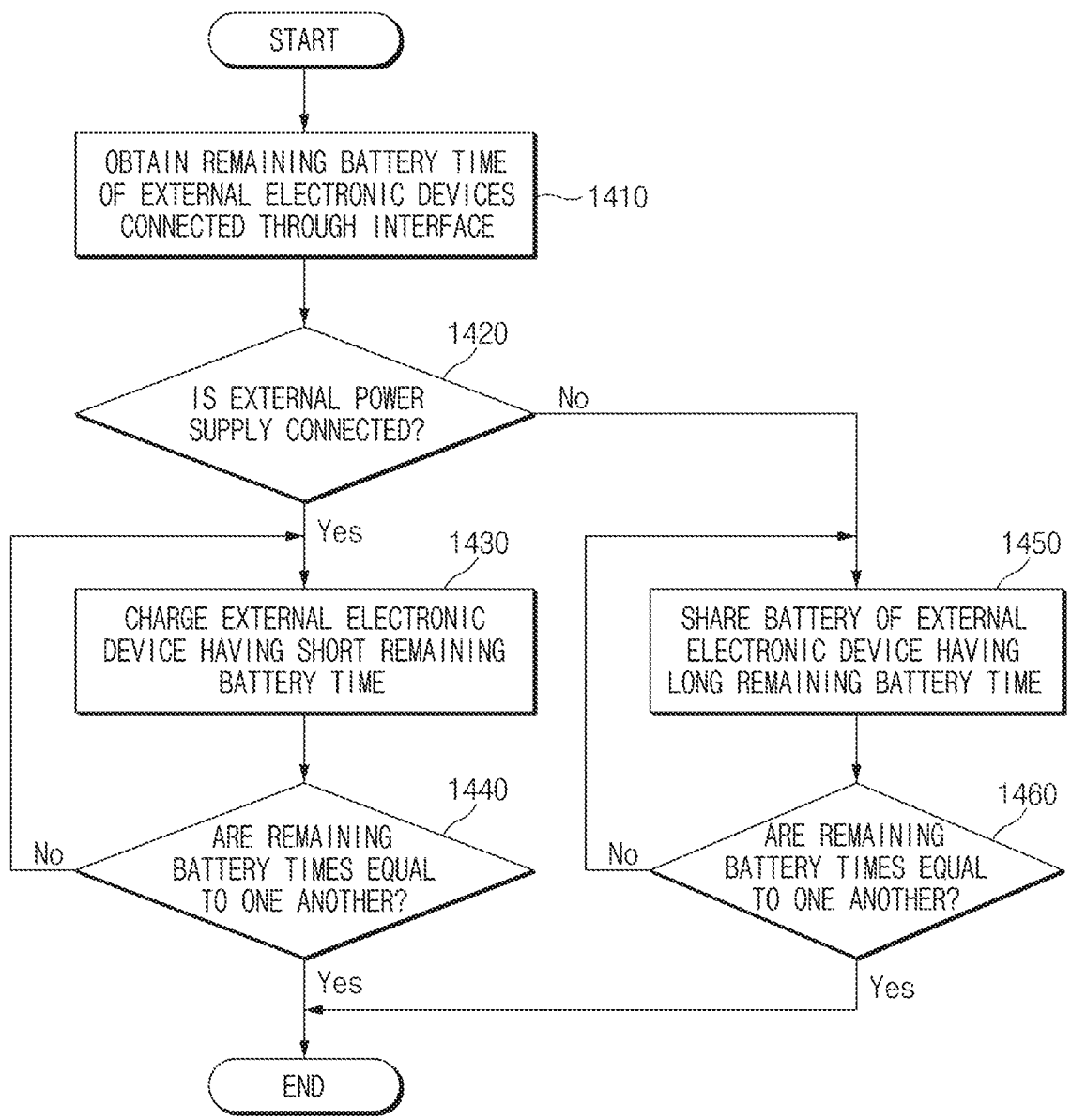
FIG. 14 is a diagram of describing another operation method of an electronic device related to a power management function according to an embodiment.

FIG. 14 is a diagram of describing another operation method of an electronic device related to a power management function according to an embodiment.

Referring to FIG. 14, an electronic device (e.g., the electronic device 100 or 1200) may, in operation 1410, obtain remaining battery times of external electronic devices connected through an interface. In addition, when obtaining the remaining battery times of the external electronic devices, the electronic device may compare the obtained remaining battery times with one another.

In operation 1420, the electronic device may determine whether an external power supply is connected thereto. When the external power supply is connected, in operation 1430, the electronic device may first charge a battery of an external electronic device having a relatively short remaining battery time among the external electronic devices, based on a result of comparison of the remaining battery times. In addition, in operation 1440, the electronic device may determine whether the remaining battery times of the external electronic devices are substantially equal to one another. When the remaining battery times of the external electronic devices are not equal to each other, the electronic device may return to operation 1430. According to an embodiment, when the remaining battery times of the external electronic devices are equal to one another, the electronic device may simultaneously charge the batteries of the external electronic devices (up to the maximum charge limit)

When an external power supply is not connected, in operation 1450, the electronic device may share a battery of an external electronic device having a relatively long remaining battery time among the external electronic devices, based on a result of comparison of the remaining battery times. In addition, in operation 1460, the electronic device may determine whether the remaining battery times of the external electronic devices are substantially equal to one another. When the remaining battery times of the external electronic devices are not equal to one another, the electronic device may return to operation 1450. According to an embodiment, when the remaining battery times of the external electronic devices are equal to one another, the electronic device may terminate sharing of the battery.

Figure 15:
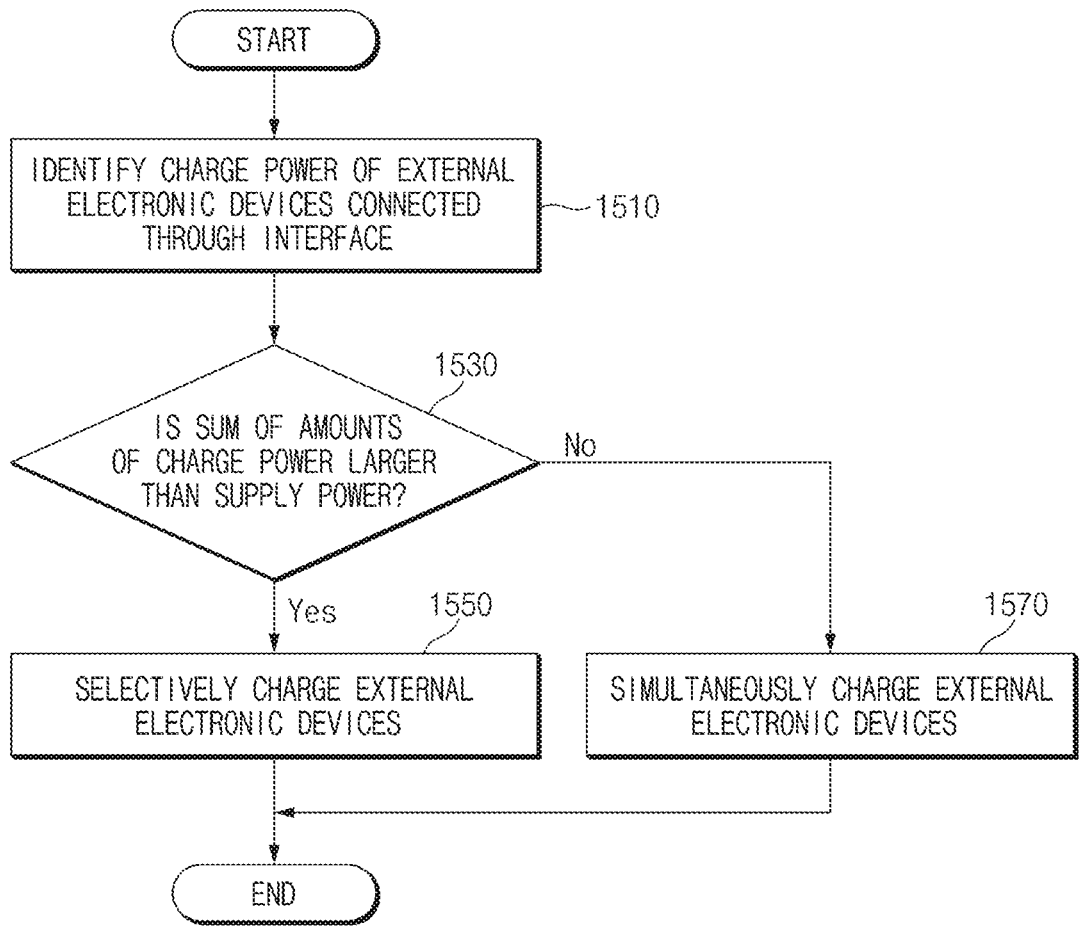
FIG. 15 is a diagram of describing still another operation method of an electronic device related to a power management function according to an embodiment.

FIG. 15 is a diagram of describing still another operation method of an electronic device related to a power management function according to an embodiment.

Referring to FIG. 15, an electronic device (e.g., the electronic device 100 or 1200) may, in operation 1510, identify charge power of external electronic devices connected through an interface.

In operation 1530, the electronic device may determine whether the sum of the amounts of charge power of the external electronic devices is larger than supply power capable of being supplied to the external electronic devices. As an example, the electronic device may determine whether the sum of the amounts of power for charging the external electronic devices is larger than the amount of power supplied from an internal battery of the electronic device or an external power supply connected to the electronic device.

According to an embodiment, when the sum of the amounts of charge power is larger than the supply power, the electronic device may, in operation 1550, selectively charge the batteries of the external electronic devices. As an example, the electronic device may first charge an external electronic device having a relatively short remaining battery time, among the external electronic devices. When the remaining battery times of the external electronic devices are substantially equal to one another, the electronic device may simultaneously charge the batteries of the external electronic devices up to the maximum charge limit.

According to an embodiment, when the sum of the amounts of charge power is not larger than the supply power, in operation 1570, the electronic device may simultaneously charge the batteries of the external electronic devices.

As described above, according to various embodiments, a power management method of an electronic device may include obtaining a first remaining battery time of a first battery included in a first external electronic device connected through at least one interface, obtaining a second remaining battery time of a second battery included in a second external electronic device connected through the at least one interface, and managing power of at least one of the first battery and the second battery such that the first remaining battery time of the first battery and the second remaining battery time of the second battery are substantially equal to each other.

According to various embodiments, the obtaining of the first remaining battery time of the first battery may include obtaining a first remaining battery capacity of the first battery and calculating the first remaining battery time of the first battery based on the first remaining battery capacity of the first battery, and the obtaining of the second remaining battery time of the second battery may include obtaining a second remaining battery capacity of the second battery and calculating the second remaining battery time of the second battery based on the second remaining battery capacity of the second battery.

According to various embodiments, the managing of the power of the at least one of the first battery and the second battery may include, when the first remaining battery time of the first battery is smaller than the second remaining battery time of the first battery, supplying power of the second battery to the first battery.

According to various embodiments, the managing of the power of the at least one of the first battery and the second battery may include setting at least one of orders of supplying power to the first battery and the second battery from an internal battery included in the electronic device and amounts of supply power based on the first remaining battery time of the first battery and the second remaining battery time of the second battery.

According to various embodiments, the managing of the power of the at least one of the first battery and the second battery may include, when power is supplied from an external power supply through a charger circuit included in the electronic device, setting at least one of orders of supplying power to the first battery and the second battery from the charger circuit and amounts of supply power based on the first remaining battery time of the first battery and the second remaining battery time of the second battery.

According to various embodiments, the power management method may further include displaying at least one of the first remaining battery time of the first battery and the second remaining battery time of the second battery through a display exposed to outside of the housing of the electronic device.

According to various embodiments, the power management method may further include, when the first external electronic device includes a display, displaying at least one of the first remaining battery time of the first battery and the second remaining battery time of the second battery through the display of the first external electronic device.

The term "module" used in the disclosure may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media in the form of a program module. The instruction, when executed by a processor (e.g., the processor 130), may cause the processor to perform a function corresponding to the instruction.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, or the like. The instruction may contain a code made by a compiler or a code executable by an interpreter.

A module or a program module according to various embodiments may include at least one of the above components, or a part of the above components may be omitted, or additional other components may be further included. Operations performed by a module, a program module, or other components according to various embodiments may be executed sequentially, in parallel, repeatedly, or in a heuristic method. In addition, some operations may be executed in different sequences or may be omitted. Alternatively, other operations may be added.

The invention claimed is:

1. An electronic device comprising:
   a housing;
   a seating portion formed in the housing, a first external electronic device and a second external electronic device being seated in the seating portion;
   at least one interface electrically connected to the first external electronic device and the second external electronic device to transmit and receive power; and
   a processor electrically connected to the at least one interface,
   wherein the processor is configured to:
      obtain a first remaining battery time of a first battery included in the first external electronic device connected through the at least one interface,
      obtain a second remaining battery time of a second battery included in the second external electronic device connected through the at least one interface, and manage power of at least one of the first battery and the second battery such that the first remaining battery time of the first battery and the second remaining battery time of the second battery are substantially equal to each other.

2. The electronic device of claim 1, wherein the processor is configured to obtain a first remaining battery capacity of the first battery and calculate the first remaining battery time of the first battery based on the first remaining battery capacity of the first battery, as at least a part of operation of obtaining the first remaining battery time of the first battery, and wherein the processor is configured to obtain a second remaining battery capacity of the second battery and calculate the second remaining battery time of the second battery based on the second remaining battery capacity of the second battery, as at least a part of operation of obtaining the second remaining battery time of the second battery.

3. The electronic device of claim 1, wherein the processor is configured to supply power of the second battery to the first battery when the first remaining battery time of the first battery is smaller than the second remaining battery time of the second battery, as at least a part of operation of managing the power of the at least one of the first battery and the second battery.

4. The electronic device of claim 1, further comprising:
an internal battery electrically connected to the processor,
wherein the processor is configured to set at least one of orders of supplying power to the first battery and the second battery from the internal battery and amounts of supply power based on the first remaining battery time of the first battery and the second remaining battery time of the second battery, as at least a part of operation of managing the power of the at least one of the first battery and the second battery.

5. The electronic device of claim 1, further comprising:
a charger circuit configured to receive power from an external power supply,
wherein the processor is configured to set at least one of orders of supplying power to the first battery and the second battery from the external power supply and amounts of supply power based on the first remaining battery time of the first battery and the second remaining battery time of the second battery when receiving power from the external power supply through the charger circuit, as at least a part of operation of managing the power of the at least one of the first battery and the second battery.

6. The electronic device of claim 1, further comprising:
a display exposed to outside of the housing,
wherein the processor is configured to display at least one of the first remaining battery time of the first battery and the second remaining battery time of the second battery through the display.

7. The electronic device of claim 1, wherein, when the first external electronic device includes a display, the processor is configured to display at least one of the first remaining battery time of the first battery and the second remaining battery time of the second battery through the display of the first external electronic device.

8. The electronic device of claim 1, further comprising:
a cover configured to cover at least one side of the housing.

9. The electronic device of claim 8, wherein at least a partial region of the cover is transparent.

10. The electronic device of claim 1, wherein the first external electronic device is an unmanned aerial vehicle and the second external electronic device is a controller of the unmanned aerial vehicle.

11. The electronic device of claim 1, wherein the first external electronic device and the second external electronic device are wireless headsets or wireless earphones.

12. A power management method of an electronic device, comprising:
obtaining a first remaining battery time of a first battery included in a first external electronic device connected through at least one interface;
obtaining a second remaining battery time of a second battery included in a second external electronic device connected through the at least one interface; and
managing power of at least one of the first battery and the second battery such that the first remaining battery time of the first battery and the second remaining battery time of the second battery are substantially equal to each other,
wherein the managing of the power of the at least one of the first battery and the second battery includes setting at least one of orders of supplying power to the first battery and the second battery from an internal battery included in the electronic device and amounts of supply power based on the first remaining battery time of the first battery and the second remaining battery time of the second battery.

13. The power management method of claim 12, wherein the obtaining of the first remaining battery time of the first battery includes obtaining a first remaining battery capacity of the first battery and calculating the first remaining battery time of the first battery based on the first remaining battery capacity of the first battery, and wherein the obtaining of the second remaining battery time of the second battery includes obtaining a second remaining battery capacity of the second battery and calculating the second remaining battery time of the second battery based on the second remaining battery capacity of the second battery.

14. The power management method of claim 12, wherein the managing of the power of the at least one of the first battery and the second battery includes supplying power of the second battery to the first battery when the first remaining battery time of the first battery is smaller than the second remaining battery time of the first battery.

* * * * *